(12) United States Patent
Krishnamoorthy et al.

(10) Patent No.: US 7,961,990 B2
(45) Date of Patent: Jun. 14, 2011

(54) MULTI-CHIP SYSTEM INCLUDING CAPACITIVELY COUPLED AND OPTICAL COMMUNICATION

(75) Inventors: Ashok V. Krishnamoorthy, San Diego, CA (US); James G. Mitchell, Palo Alto, CA (US); John E. Cunningham, San Diego, CA (US); Brian W. O'Krafka, Austin, TX (US)

(73) Assignee: Oracle America, Inc., Redwood Shores, CA (US)

( * ) Notice: Subject to any disclaimer, the term of this patent is extended or adjusted under 35 U.S.C. 154(b) by 753 days.

(21) Appl. No.: 11/962,419

(22) Filed: Dec. 21, 2007

(65) Prior Publication Data

US 2010/0266240 A1   Oct. 21, 2010

(51) Int. Cl.
*G02B 6/10* (2006.01)
*G02B 6/12* (2006.01)

(52) U.S. Cl. ......... 385/14; 385/129; 398/128; 398/130; 398/135; 398/138; 398/139; 398/141

(58) Field of Classification Search .................... 385/14, 385/129–132; 398/128–131, 135, 138–141, 398/156
See application file for complete search history.

(56) References Cited

U.S. PATENT DOCUMENTS

| | | | |
|---|---|---|---|
| 5,629,838 A | | 5/1997 | Knight et al. |
| 6,500,696 B2 * | | 12/2002 | Sutherland .................... 438/109 |
| 6,916,719 B1 * | | 7/2005 | Knight et al. ................. 438/381 |
| 7,356,213 B1 * | | 4/2008 | Cunningham et al. ......... 385/14 |
| 7,525,199 B1 * | | 4/2009 | Lauterbach et al. .......... 257/777 |
| 7,816,793 B2 * | | 10/2010 | Krishnamoorthy et al. .. 257/777 |
| 7,817,880 B1 * | | 10/2010 | Drost et al. ...................... 385/14 |
| 2004/0197046 A1 * | | 10/2004 | Drost et al. ...................... 385/14 |
| 2005/0285214 A1 * | | 12/2005 | Krishnamoorthy et al. .. 257/414 |

OTHER PUBLICATIONS

Little et al., Microring Resonator Channel Dropping Filters, Journal of Light Technology, vol. 15, No. 6, Jun. 1997, pp. 998-1005.
Yariv, A., Critical Coupling and Its Control in Optical Waveguide-Ring Resonator Systems, IEEE Photonocs Technology Letters, vol. 14, No. 4, Apr. 2002 pp. 483-485.
Klein et al., Wavelength-Selective Switch Using Thermally Tunable Microring Resonators, Laser and Electro-Optics Society, 2003, LEOS 2003, the 16th Annual Meeting of the IEEE, vol. 1, Oct. 27-28, 2003, pp. 126-127.

(Continued)

*Primary Examiner* — Daniel Petkovsek
(74) *Attorney, Agent, or Firm* — Park, Vaughan, Fleming & Dowler LLP; Steven E. Stupp

(57) ABSTRACT

Embodiments of a system are described. This system includes an array of chip modules (CMs) and a baseplate, where the baseplate is configured to communicate data signals via optical communication. Moreover, the array includes first CMs mechanically coupled to first alignment features on the baseplate, and adjacent second CMs mechanically coupled to second alignment features on the baseplate. In this array, a given first CM is electrically coupled to a given set of electrical proximity connectors. Additionally, the array includes bridge components, wherein a given bridge component is electrically coupled to the second SCM and another set of electrical proximity connectors, which is electrically coupled to the set of electrical proximity connectors, thereby facilitating communication of other data signals between adjacent first CMs and second CMs via electrical proximity communication. Moreover, the given bridge component is optically coupled to the baseplate, thereby facilitating optical communication of the data signals between CMs via the baseplate.

19 Claims, 21 Drawing Sheets

OTHER PUBLICATIONS

Guezebroek et al., Thermally Tuneable, Wide FSR Switch Based on Micro-ring Resonators, Proceedings Symposium IEEE/LEOS Benelux Chapter, Amsterdam, pp. 155-158, 2002.

Little, et al., Very High-Order Microring Resonator Filters for WDM Applications, IEEE Photonics Technology Letters, vol. 16, No. 10, pp. 2263-2265, 2004.

* cited by examiner

┌─────────────────────────────────────────────────────────────┐
│ RECEIVE ELECTRICAL SIGNALS FROM A FIRST CHIP MODULE (*CM*) AT A │
│ SECOND *CM* VIA A BRIDGE CHIP IN A MULTI-CHIP MODULE (*MCM*), WHERE AT │
│ LEAST THE FIRST *CM* IS CONFIGURED TO COMMUNICATE WITH THE BRIDGE │
│ CHIP USING ELECTRICAL PROXIMITY COMMUNICATION THROUGH │
│ ELECTRICALLY COUPLED PROXIMITY CONNECTORS │
│ <u>1910</u> │
└─────────────────────────────────────────────────────────────┘
                                │
                                ▼
┌─────────────────────────────────────────────────────────────┐
│ RECEIVE ELECTRICAL SIGNALS FROM A THIRD *CM* AT THE SECOND *CM* VIA │
│ BRIDGE CHIPS IN THE *MCM*, WHERE THE THIRD *CM* IS CONFIGURED TO │
│ COMMUNICATE WITH ANOTHER BRIDGE CHIP USING ELECTRICAL PROXIMITY │
│ COMMUNICATION THROUGH ELECTRICALLY COUPLED PROXIMITY │
│ CONNECTORS, WHERE THE BRIDGE CHIP AND THE OTHER BRIDGE CHIP ARE │
│ CONFIGURED TO COMMUNICATE WITH EACH OTHER VIA OPTICAL │
│ COMMUNICATION IN AN OPTICAL SIGNAL PATH IN A BASEPLATE IN THE *MCM*, │
│ AND WHERE A GIVEN BRIDGE CHIP, WHICH CAN BE THE BRIDGE CHIP OR THE │
│ OTHER BRIDE CHIP, IS CONFIGURED TO COMMUNICATE WITH THE BASEPLATE │
│ USING OPTICALLY COUPLED PROXIMITY CONNECTORS │
│ <u>1912</u> │
└─────────────────────────────────────────────────────────────┘

FIG. 19

MULTI-CHIP SYSTEM INCLUDING CAPACITIVELY COUPLED AND OPTICAL COMMUNICATION

GOVERNMENT LICENSE RIGHTS

This invention was made with United States Government support under Contract No. NBCH3039002 awarded by the Defense Advanced Research Projects Administration. The United States Government has certain rights in the invention.

CROSS REFERENCE TO RELATED APPLICATIONS

This application is related to U.S. patent application Ser. No. 11/863,815, entitled "Wavelength-Division Multiplexing for Use in Multi-Chip Systems," filed Sep. 28, 2007; U.S. patent application Ser. No. 11/864,408, entitled "Integrated-Circuit Package for Proximity Communication," filed Sep. 28, 2007; U.S. Pat. No. 7,865,084, entitled "Multi-Chip Systems with Optical Bypass," filed Sep. 11, 2007; U.S. patent application Ser. No. 11/728,845, entitled "Multi-Chip Systems Using On-Chip Photonics," filed Mar. 26, 2007; U.S. Pat. No. 7,840,136, entitled "Low-Latency Switch Using Optical and Electrical Proximity Communication," filed Mar. 26, 2007; U.S. Pat. No. 7,356,213, entitled "Transparent Switch Using Optical and Electrical Proximity Communication," filed Mar. 26, 2007; U.S. Pat. No. 7,486,853, entitled "Resonator System for Optical Proximity Communication," filed Aug. 31, 2006; U.S. Pat. No. 7,574,077, entitled "Optical Imaging Device for Optical Proximity Communication," filed Aug. 31, 2006; U.S. patent application Ser. No. 11/165,996, entitled "Proximity Active Connector and Cable," filed on Jun. 24, 2005; and U.S. Pat. No. 7,458,067, entitled "Method and Apparatus for Optimizing Computer Program Performance Using Steered Execution," filed on Mar. 18, 2005, the contents of each of which are herein incorporated by reference.

BACKGROUND

1. Field of the Invention

The present invention relates to techniques for communicating signals in semiconductor dies and multi-chip systems. More specifically, the present invention relates to a multi-chip system which includes semiconductor dies that communicate signals using electrical proximity communication and optical communication.

2. Related Art

Advances in semiconductor technology have led to significant increases in microprocessor performance. For example, the clock frequency of a typical microprocessor increased from 16 MHz in 1985 to 3600 MHz by 2005, an improvement of 230 times, which represents an annual growth rate of nearly 30%. These performance gains have allowed computers to perform increasingly complicated operations across a wide variety of applications.

Unfortunately, several issues are beginning to constrain further increases in the clock frequency. In particular, the latency of global on-chip wires is increasing as technological trends reduce their thickness but not their length. In contrast, many local wires do not suffer from this delay penalty because their lengths shrink along with their thickness.

Moreover, as integration densities and clock frequencies continue to increase, the power consumption of high-performance microprocessors also increases. Consequently, many existing microprocessors consume over 100 W of power, which strains the capabilities of air cooling systems. In fact, many microprocessors have become power-limited, which means they could be operated at higher clock frequencies at the cost of significant increases in power consumption, and thus, in required cooling.

These design constraints have led designers to change microprocessor designs. In particular, many microprocessors now include multiple processor cores. These multiple processor cores keep computation and associated communication operations local, which reduces global delays in critical paths. Additionally, individual processor cores can be selectively enabled, thereby allowing unused processor cores to be put into a sleep mode to conserve power and then awakened when they are needed. Moreover, the use of smaller processor cores with shared logical blocks reduces the cost of developing and debugging microprocessors.

Furthermore, many multiple-core microprocessors support chip multi-threading (CMT). This technique helps address the increasing gap between microprocessor performance and the latency associated with fetching instructions and data from main memory, which has grown from a few clock cycles to hundreds of clock cycles over the past two decades. This gap often limits system performance because the microprocessor spends an increasing amount of time waiting for memory accesses instead of executing code. In a microprocessor that uses CMT, a thread can be quickly swapped in and out of execution. This rapid thread switching improves overall system throughput because instead of waiting for a memory request to return when the current thread accesses memory, the microprocessor can put the current thread to sleep and reactivate another thread. Consequently, utilization and throughput in such multi-threaded microprocessors is much higher than in single-threaded microprocessors.

However, microprocessors that include multiple cores and support multiple threads executing on each core have significantly higher communication requirements than single-core, single-threaded microprocessors. In particular, these microprocessors use high-bandwidth communication to maintain coherence; pass messages; and/or perform simultaneous memory accesses. Moreover, as microprocessor throughput continues to increase, corresponding bandwidth requirements are expected to increase to terabits-per-second and beyond. Given the aforementioned latency problems, it may be difficult to meet these requirements using conventional conductive wires.

Hence, what is needed is a method and an apparatus which provide improved communication bandwidth without the problems listed above.

SUMMARY

One embodiment of the present invention provides a system that includes an array of chip modules (CMs) and a baseplate, where the baseplate is configured to communicate data signals via optical communication. Moreover, the array includes first CMs mechanically coupled to first alignment features on the baseplate, and adjacent second CMs mechanically coupled to second alignment features on the baseplate. In this array, a given first CM is electrically coupled to a given set of electrical proximity connectors. Additionally, the array includes bridge components, wherein a given bridge component is electrically coupled to the second CM and another set of electrical proximity connectors, which is electrically coupled to the set of electrical proximity connectors, thereby facilitating communication of other data signals between adjacent first CMs and second CMs via electrical proximity communication. Moreover, the given bridge component is optically coupled to the baseplate, thereby facilitating optical communication of the data signals between CMs via the baseplate.

In some embodiments, the baseplate includes one or more optical signal paths. For example, the optical signal paths may include one or more waveguides.

In some embodiments, the data signals are communicated via the optical signal paths as optical signals without intervening processing as electrical signals.

In some embodiments, the given bridge component is optically coupled to the baseplate via optical coupling elements. For example, the optical coupling elements can include: a lens, a diffraction grating, a micro-sphere and/or a mirror.

In some embodiments, the data signals are communicated between a given pair of CMs via optical communication when the given pair of CMs in the array is separated by more than a pre-determined distance. Note that the given pair of CMs can include: one of the first CMs and one of the second CMs, two of the first CMs, or two of the second CMs. Moreover, in some embodiments the pre-determined distance corresponds to more than one intervening CM between the given pair of CMs, where the intervening CM can be one of the first CMs or one of the second CMs.

In some embodiments, the other data signals are communicated between the given pair of CMs via electrical proximity communication when the given pair of CMs in the array is separated by less than a pre-determined distance. For example, the pre-determined distance may accommodate at most one intervening CM between the given pair of CMs, and the intervening CM can be one of the first CMs or one of the second CMs.

In some embodiments, the electrical proximity communication includes capacitively coupled proximity communication.

In some embodiments, the array of CMs is a 2-dimensional array of CMs.

In some embodiments, the given bridge component includes a conversion element configured to convert electrical signals to optical signals and another conversion element configured to convert the optical signals to the electrical signals. Moreover, the given bridge component may include an add-drop element configured to insert optical signals on to an optical signal path on the baseplate and/or to remove the optical signals from the optical signal path.

In some embodiments, the set of electrical proximity connectors is proximate to a surface of the given first CM, and the other set of electrical proximity connectors is proximate to a surface of the given bridge component In some embodiments, the first alignment features and the second alignment features include depressions. Moreover, the first alignment features and the second alignment features may facilitate mechanical alignment of: the first CMs with respect to the baseplate; the bridge components with respect to the baseplate; and the first CMs with respect to the bridge components. Note that the mechanical alignment may be within a pre-determined misalignment. For example, the pre-determined misalignment may be along a dimension in a plane the substantially includes the set of proximity connectors or the other set of proximity connectors, and the pre-determined misalignment may be less than one half of a pitch of a subset of the set of the proximity connectors or a subset of the other set of proximity connectors along the dimension. Additionally, the pre-determined misalignment may be along a dimension that is substantially perpendicular to the plane that substantially includes the set of proximity connectors or the other set of proximity connectors.

Another embodiment of the present invention provides a computer system that includes the array.

Another embodiment of the present invention provides a method for communicating data signals in an array of CMs. During this method, a second CM receives electrical signals from a first CM via a bridge chip in a multi-chip module (MCM) using electrical proximity communication through electrically coupled proximity connectors. Next, the second CM receives electrical signals from a third CM via bridge chips in the MCM, where the third CM is configured to communicate with another bridge chip using electrical proximity communication through electrically coupled proximity connectors. Note that the bridge chip and the other bridge chip are configured to communicate with each other via optical communication in an optical signal path in a baseplate in the MCM. Additionally, a given bridge chip, which can be the bridge chip or the other bridge chip, is configured to communicate with the baseplate using optically coupled proximity communication.

BRIEF DESCRIPTION OF THE FIGURES

FIG. 19 is a flow chart illustrating a process for communicating signals in accordance with an embodiment of the present invention.

Note that like reference numerals refer to corresponding parts throughout the drawings.

DETAILED DESCRIPTION

Figure 1A:
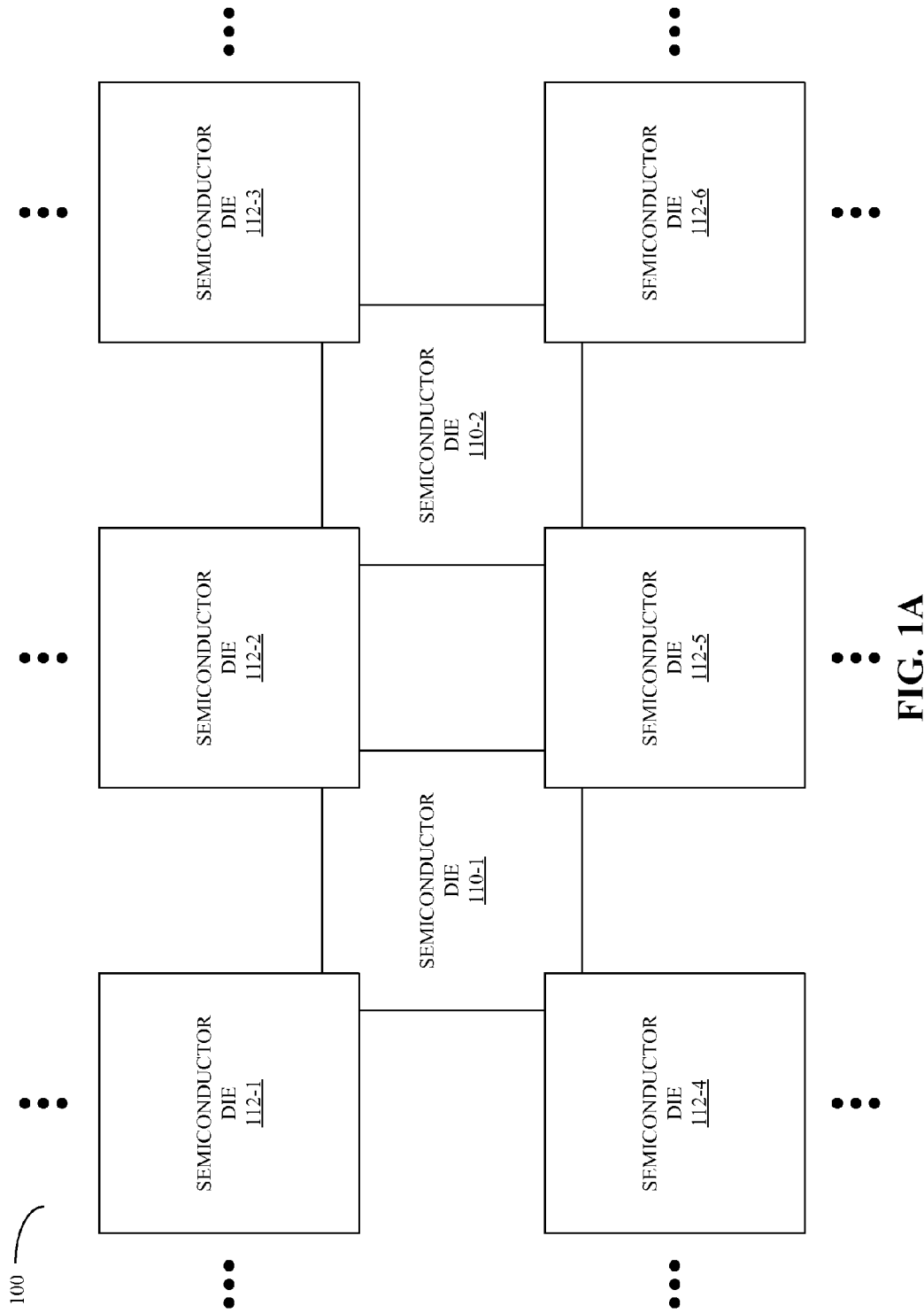
FIG. 1A is a block diagram illustrating a multi-chip module in accordance with an embodiment of the present invention.

The following description is presented to enable any person skilled in the art to make and use the invention, and is provided in the context of a parti-cular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a multi-chip module (MCM) (such as a switch or a processor), and systems that include the MCM are described. This MCM includes an array of chip modules (CMs) or single-chip modules (SCMs), and a given SCM includes at least one semiconductor die. Note that the MCM is sometimes referred to as a 'macro-chip.' Furthermore, the semiconductor die communicates with other semiconductor dies, CMs, SCMs, and/or devices in the MCM using proximity communication of electromagnetically coupled signals (which is referred to as 'electromagnetic proximity communication'), such as capacitively coupled signals and/or proximity communication of optical signals (which are, respectively, referred to as 'electrical proximity communication' and 'optical proximity communication'). In some embodiments, the electromagnetic proximity communication includes inductively coupled signals and/or conductively coupled signals.

In some embodiments, a first component (such as the semiconductor die) in the MCM is situated face-to-face with a bridge chip such that proximity pads or connectors on the first component are electromagnetically coupled with proximity pads or connectors on the bridge chip. For example, the electromagnetic coupling may include capacitive coupling. Additionally, the bridge chip may be electrically coupled to a second component (such as another semiconductor die). In some embodiments, the electrical coupling includes electromagnetic coupling to additional proximity pads or connectors on or coupled to the second component.

Note that the electromagnetic coupling and/or the electrical coupling of the bridge chip to the first component and the second component facilitates communication of electromagnetic signals or data between components (such as adjacent components or nearest neighbors in the MCM) without having to route the signals through intervening signal lines within a printed circuit board.

However, communication of signals over longer distances in the MCM may be implemented via a baseplate. In particular, the bridge chip may be coupled to the baseplate via optical proximity communication, and the baseplate may include one or more optical signal paths (such as one or more optical waveguides). Optical signals in a given optical signal path may be coupled, via optical proximity communication, to another bridge chip, which, in turn, is either electrically coupled and/or electromagnetically coupled to a third component (such as yet another semiconductor die). In this way, data may be communicated between semiconductor dies in the MCM that are not adjacent or nearest neighbors.

By combining electrical proximity communication and optical communication in the MCM, high bandwidth inter-chip communication with low latency may be obtained. Consequently, these techniques may facilitate the creation of arbitrarily large arrays with very high performance.

Embodiments of the MCM may be used in a variety of applications, including: VLSI circuits, telephony, storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, I/O devices, and/or peripheral devices). In some embodiments, the MCM performs the functions of: a switch, a hub, a bridge, and/or a router. Note that the electrical signals and/or optical signals may include analog signals, data packets, and/or data streams. These signals may include binary symbols, un-encoded signals, and/or encoded symbols (for example, using multiple-pulse amplitude modulation and/or WDM, where different sub-channels are used to communicate information). Moreover, communication in the optical signal path may be: unidirectional or bidirectional (including half-duplex and/or full-duplex operation).

We now describe embodiments of a macro-chip or MCM. FIG. 1A presents a block diagram illustrating a top-view of an embodiment of an MCM 100. This MCM includes an array of multiple semiconductor dies 110 and 112. Proximity connectors on the corners (and more generally on side edges) of the semiconductor dies 110 and 112 overlap and couple signals between adjacent semiconductor dies using electromagnetic proximity communication, such as capacitive and/or optical proximity communication. Thus, in some embodiments semiconductor dies 110 are face up and semiconductor dies 112 are face down. However, in other embodiments semiconductor dies 110 are face down and semiconductor dies 112 are face up.

In an exemplary embodiment, MCM 100 includes a computer system, including one or more processors and/or memories. In some embodiments, MCM 100 includes a switch. In these embodiments, one or more of the semiconductor dies 110 and 112 implement some or all of the functionality of a switch. Such semiconductor dies are sometimes referred to as 'switch chips' or 'logic chips.' Therefore, one or more of the semiconductor dies 110 and 112 may include I/O ports to communicate input signals and output signals, as well as multiple switching elements that selectively couple the input and output ports. Furthermore, in some embodiments at least one of the semiconductor dies 110 and 112 includes a flow-control mechanism or logic that provides flow-control information that configures the switching elements or determines routing of data. This flow-control information may be communicated in the electrical domain and/or in the optical domain, and may be communicated along with the data and/or separately from the data (for example, in a separate flow-control communication channel, i.e., out-of-band control). Moreover, flow-control logic may be internal or external to MCM 100 (or MCM 130 in FIG. 1B), and flow-control logic may be central or distributed.

Figure 1B:
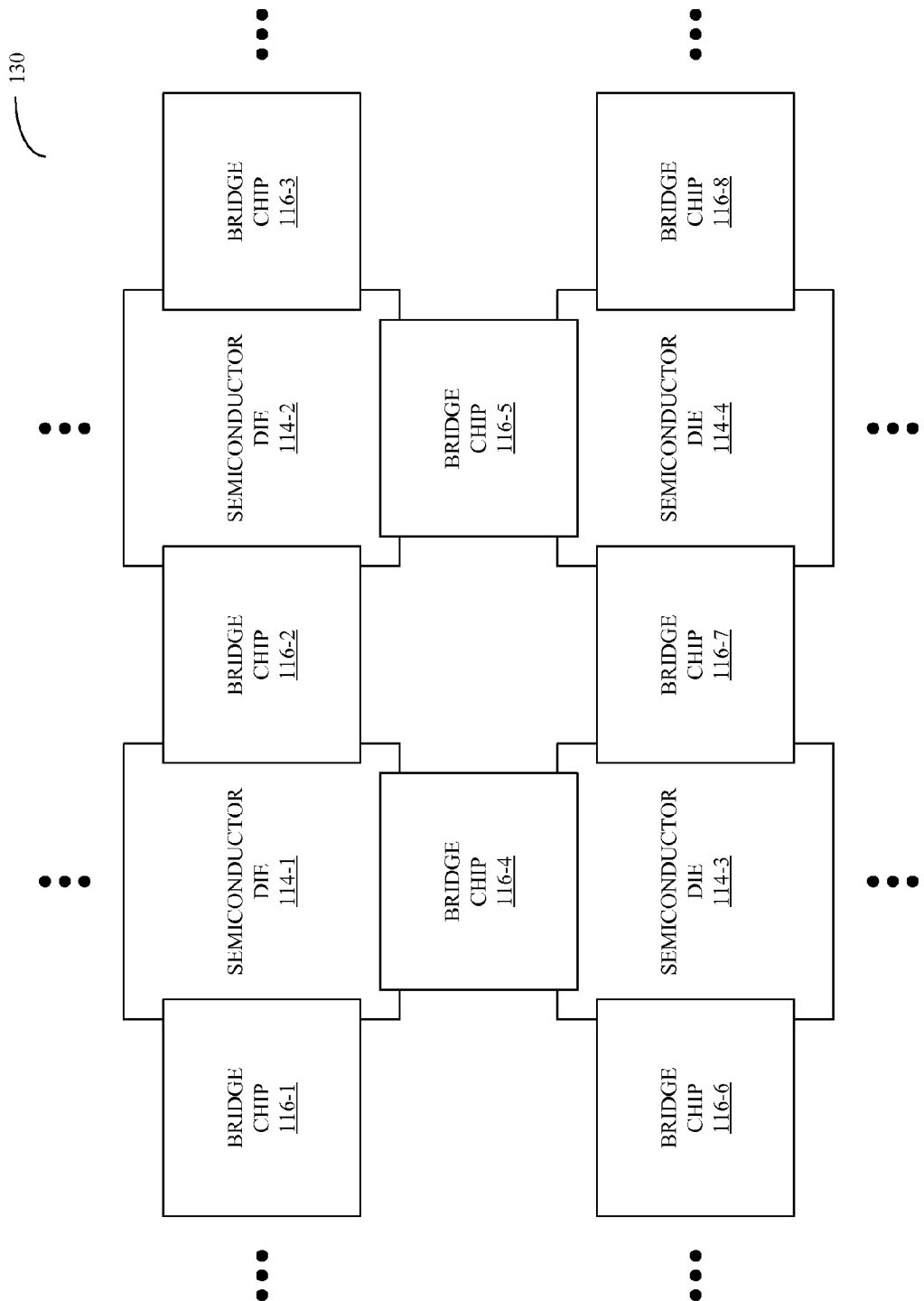
FIG. 1B is a block diagram illustrating a multi-chip module in accordance with an embodiment of the present invention.

FIG. 1B presents a block diagram illustrating a top view of an embodiment of MCM 130 (which may include a computer system and/or a switch). This MCM includes an array of multiple semiconductor dies 114 and bridge chips 116. Proximity connectors on the side edges (and in some embodiments on the corners) of the semiconductor dies 114 and the bridge chips 116 overlap and couple signals between adjacent components in the MCM 130 using electromagnetic proximity communication, such as capacitive and/or optical proximity communication. In some embodiments semiconductor dies 114 are face up and the bridge chips 116 are face down. However, in other embodiments semiconductor dies 114 are face down and the bridge chips 116 are face up.

Note that the bridge chips 116 may include one or more waveguides and/or multiple signal lines that couple signals from receive proximity connectors on one end of the bridge chips 116 to transmit proximity connectors on the other end. Such communication across the bridge chips 116 may be synchronous and/or asynchronous. In some embodiments bridge chips 116 include active electronics and/or optical components to transmit and receive signals, to amplify signals, and/or to resynchronize phases of signals on at least two of the signal lines. For example, the bridge chips can include a pipeline circuit that includes flip-flops and/or synchronization circuitry that are latched by clock signals to correct for an accumulated phase error. In these embodiments, the bridge chips 116 may be implemented using semiconductor dies, however, these dies may include different circuits and functionality than the semiconductor dies 114. In other embodiments, the bridge chips 116 are manufactured from a material other than a semiconductor.

As described below with reference to FIGS. 7-10, in some embodiments at least some signals (such as optical signals in an all-optical bypass) are communicated through one or more semiconductor dies 110 (FIG. 1A) and/or 112 (FIG. 1A), or through semiconductor dies 114 and/or bridge chips 116 without detection or conversion by active electronics or optical components. For example, switching or routing in MCMs 100 (FIG. 1A) and/or 130 may include optical switching, i.e., the data and the flow-control information may traverse the array entirely in the optical domain. (However, in general data and/or flow-control information may traverse the array using either capacitively coupled and/or optical communication.) Moreover, the optical signals may be amplified during communication in the optical domain.

In an exemplary embodiment, MCM 130 includes a 6×6 array of semiconductor dies 114 and a 5×5 array of bridge chips 116. In another exemplary embodiment, MCM 130 includes a 4×4 array of semiconductor dies 114 and a 3×3 array of bridge chips 116. Furthermore, electric and optical information in MCMs 100 (FIG. 1A) and 130 may flow in each of the four principal directions (North, South, East, and West) in the MCMs 100 (FIG. 1A) and 130. However, in some embodiments, electric and optical information flow along orthogonal directions in the MCMs 100 (FIG. 1A) and 130 (for example, optical information may flow East-West and electrical information may flow North-South).

In another exemplary embodiment of MCMs 100 (FIG. 1A) and/or 130, data is communicated between semiconductor dies 100 (FIG. 1A) and 112 (FIG. 1A) and/or semiconductor dies 114 that are not nearest neighbors using optical signals (for example, using all-optical bypasses).

Note that because of the use of proximity communication in the MCMs 100 (FIG. 1A) and 130, each of the interior components has a high-bandwidth connection to its immediate neighbors, and the bisection bandwidth of the MCMs 100 (FIG. 1A) and 130 may approach that of a single wafer-scale-integrated chip that has the same total complexity. Thus, the component-to-component bandwidth in the MCMs 100 (FIG. 1A) and 130 may be high enough to effectively hide the component boundaries and create a single 'virtual' chip.

In some embodiments, proximity communication transfers information between components in the MCMs 100 (FIG. 1A) and 130 using parallel words, thereby reducing delays. Furthermore, in some embodiments signals communicated in the MCMs 100 (FIG. 1A) and 130 are encoded (either internally or externally) using a channel code (such as time-division-multiple-access, frequency-division-multiple-access, and/or code-division-multiple-access). In an exemplary embodiment, the channel code is a DC-balanced or DC-free code. For example, the channel code may be a (n, k) code, such as an 8/10 code. In some embodiments, header information in data packets or data units is not encoded. Instead, such information may be inverted and repeated to achieve DC-balance. In embodiments where MCMs 100 (FIG. 1A) and 130 include a switch, encoding and decoding of signals may or may not be implemented in the switching elements. For example, encoding and decoding may occur external to the switch or at a centralized component.

Optical routing (in an optical control path and/or an optical signal path) on a given component in MCMs 100 (FIG. 1A) and 130 may be accomplished using: on-chip optical waveguides (such as silicon-on-insulator waveguides), ring resonators, modulators (such as phase modulators), detectors, and/or add or drop waveguides that configure input/output ports on the given component (these waveguides may include: splitters, grating couplers, and/or combiners). To avoid crossing of waveguides on the given component, optical signals may traverse the MCMs 100 (FIG. 1A) and 130 along a first axis (such as East-West) and electrical signals (including power and ground) may traverse the MCMs 100 (FIG. 1A) and 130 along a second axis (such as North-South). This configuration may offer a compact implementation and the fast switching times associated with electric circuits. However, this assignment of directional flow is for the sake of clarity and does not in any way limit the scope of the invention disclosed here. For example, optical and electrical signals may enter and exit any side of the MCMs 100 (FIG. 1A) and 130. Furthermore, optical and electrical input/output ports may be co-positioned next to each another.

Although MCMs 100 (FIG. 1A) and 130 are illustrated as having a number of discrete items, FIGS. 1A-1B and the other embodiments described below are intended to be a functional description of the various features which may be present rather than as a structural schematic of the embodiments described herein. In practice, and as recognized by those of ordinary skill in the art, the functions of the MCMs 100 (FIG. 1A) and 130 (as well as the other embodiments) may be distributed over a large number of components performing particular subsets of functions. Therefore, the MCMs 100 (FIG. 1A) and 130 (as well as the other embodiments) may include fewer components or additional components. Note that in some embodiments, proximity connectors between MCMs 100 (FIG. 1A) and 130 are remateable. Moreover, two or more components may be combined into a single component and/or a position of one or more components may be changed. For example, in some embodiments bridge chips 116 may be replaced by additional semiconductor dies 114. Furthermore, in some embodiments functions of the MCMs 100 (FIG. 1A) and 130 (as well as the other embodiments) may be implemented in hardware and/or in software.

Figure 2:
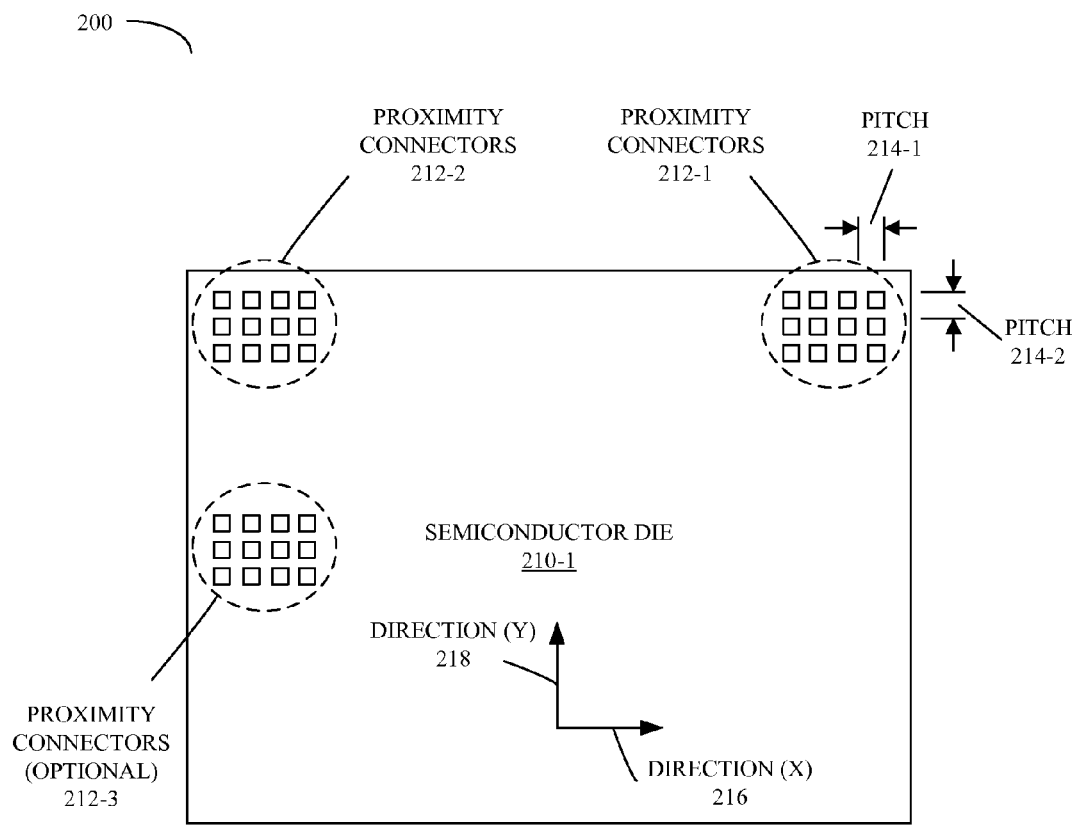
FIG. 2 is a block diagram illustrating a device that includes proximity connectors in accordance with an embodiment of the present invention.

We now described embodiments of devices (such as SCMs and MCMs) and systems that include proximity communication. FIG. 2 presents a block diagram illustrating an embodiment of a device 200 that includes proximity connectors 212 (which may be capacitive, optical, inductive, and/or conductive-based connectors). Device 200 may include at least one semiconductor die 210, where semiconductor die 210 may include integrated circuit electronics corresponding to layers deposited on a semiconductor substrate. Note that semiconductor die 210 may be packaged in an SCM and/or an MCM, where the MCM may include two or more SCMs. When packaged, for example in the SCM or the MCM, the one semiconductor die 210 is sometimes referred to as a "chip."

In one embodiment, the proximity connectors 212 may be on or proximate to at least one surface of the semiconductor die 210, the SCM and/or the MCM. In other embodiments, the semiconductor die 210, the SCM and/or the MCM may be coupled to the proximity connectors 212. In an exemplary embodiment, the plurality of proximity connectors 212 are substantially located at or near one or more corners (proximity connectors 212-1 and 212-2) and/or edges (proximity connectors 212-3) of the semiconductor die 210. In other embodiments, proximity connectors 212 may be situated at one or more arbitrary locations on, or proximate to, the surface of the semiconductor die 210.

As illustrated for the proximity connectors 212-1, there is a first pitch 214-1 between adjacent connectors or pads in a first direction (X) 216 of the surface and a second pitch 214-2 between adjacent connectors or pads in a second direction (Y) 218 of the surface. In some embodiments, the first pitch 214-1 and the second pitch 214-2 are approximately equal.

Figure 3:
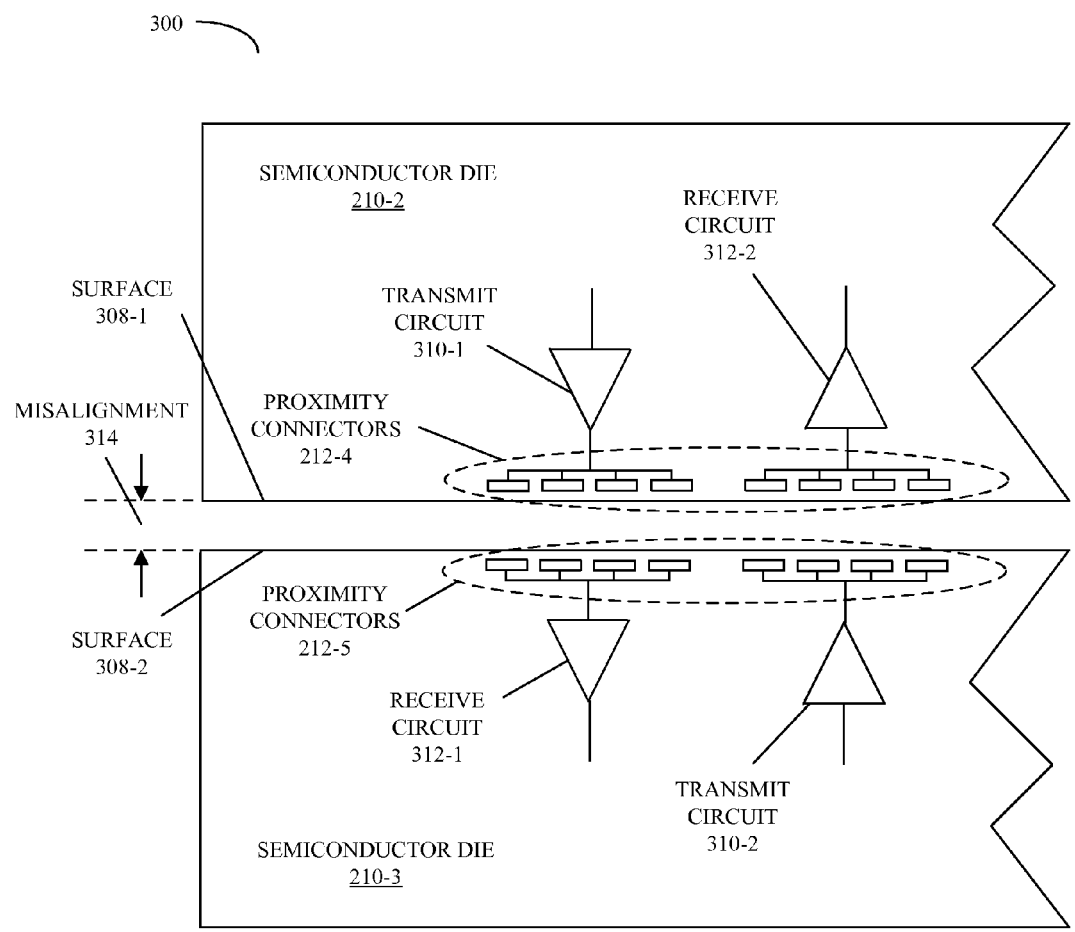
FIG. 3 is a block diagram illustrating a system that includes semiconductor dies that communicate using proximity communication in accordance with an embodiment of the present invention.

FIG. 3 presents a block diagram illustrating an embodiment of a system 300 that includes semiconductor dies 210 that communicate using capacitive proximity communication (which is used as an illustration). Semiconductor dies 210 may include proximity connectors or pads 212 that are on or proximate to at least respective surfaces 308 of the semiconductor dies 210. For example, the plurality of proximity connectors 212 may be situated beneath protective layers such that they are located below the surfaces 308. Moreover, subsets of the proximity connectors 212 may be coupled to transmit circuits 310 (such as transmit drivers) and receive circuits 312 (such as receivers). One of the transmit circuits 310, at least a subset of the proximity connectors 212 on the adjacent semiconductor dies 210, and one of the receive circuits 312 may constitute a communication channel. For example, the communication channel may include transmit circuit 310-1, some of the proximity connectors 212, and receive circuit 312-1. Note that transmit circuits 310 and receive circuits 312 may utilize voltage-mode signaling (i.e., voltage-mode drivers and receivers). Furthermore, semiconductor dies 210 may also include wiring and electronics (not shown) to relay the data signals to additional electronics on the semiconductor dies 210, such as logic, memory (for example, a packet buffer memory), I/O ports, demultiplexers, multiplexers, and switching elements.

In order to communicate data signals using proximity communication, transmit and receive proximity connectors 212 on adjacent semiconductor dies 210 may have, at worst, only limited misalignment, i.e., substantially accurate alignment. For densely packed proximity connectors, i.e., proximity connectors 212 having a small spacing or pitch 214 (FIG. 2) between adjacent pads, the alignment between two or more proximity connectors 212 on adjacent semiconductor dies 210 may be within a few microns in the first direction (X) 216 (FIG. 2) and/or a few microns in the second direction (Y) 218 (FIG. 2) in a first plane including at least some of the proximity connectors 212, and/or within a few microns in a third direction (Z) approximately perpendicular to the first plane. The system 300 illustrates a misalignment 314 in the third direction (Z).

In some embodiments, the proximity connectors 212 may be aligned in six degrees of freedom, including: the first direction (X) 216 (FIG. 2); the second direction (Y) 218 (FIG. 2); the third direction (Z); an angle in the first plane defined by the first direction (X) 216 (FIG. 2) and the second direction (Y) 218 (FIG. 2); an angle in a second plane defined by the first direction (X) 216 (FIG. 2) and the third direction (Z); and an angle in a third plane defined by the second direction (Y) 218 (FIG. 2) and the third direction (Z). Note that if a surface, such as the surface 308-1, of either of the adjacent semiconductor dies 210 is non-planar (for example, due to quadrapole distortion), additional alignment problems may be introduced.

In some embodiments, allowed misalignment in the first direction (X) 216 (FIG. 2), the second direction (Y) 218 (FIG. 2) and/or the third direction (Z) is less than one half of the pitch 214 (FIG. 2) between adjacent pads 212. For example, misalignment in the first direction (X) 216 (FIG. 2) and/or the second direction (Y) 218 (FIG. 2) may be less than 25 µm, and the misalignment 314 in the third direction (Z) may be less than 5 µm.

Solutions, such as self-alignment and/or self-adjustment of relative positions of the proximity connectors 212 on adjacent semiconductor dies 210 and/or in a component (such as one of the bridge chips 116 in FIG. 1B) coupling two or more semiconductor dies 210, may reduce and/or eliminate the misalignment 314 in the third direction (Z). For example, structures that have flexibility compliance or are spring-like may be used. In other embodiments, a feedback control loop may be used to reduce and/or eliminate the misalignment 314 in the third direction (Z).

Reducing or eliminating the misalignment 314, in turn, may lead to at least partial overlap of one or more proximity connectors 212 on the adjacent semiconductor dies 210 and increase a magnitude of the capacitively coupled data signals. In addition, the solutions may reduce misalignment in the first plane, i.e., the plane including at least some of the proximity connectors 212, when used in conjunction with techniques such as electronic steering (where data signals are routed to respective proximity connectors 212 based on the alignment in the first plane). Consequently, these solutions may facilitate proximity communication between the semiconductor dies 210, SCMs and/or MCMs. The solutions may also reduce and/or eliminate a need for narrow tolerances, precise manufacturing, and/or precise assembly of the semiconductor dies 210, the SCM and/or the MCM. In addition, improved alignment of the proximity connectors 212 may reduce power consumption in MCMs 100 (FIG. 1A) and/or 130 (FIG. 1B).

In the embodiments described above and below, the proximity connectors 212 on the adjacent semiconductor dies 210 utilize capacitive coupling and/or optical coupling for inter-chip communication. In other embodiments, different connectors may be overlapped on adjacent semiconductor dies 210. For example, one embodiment of the present invention uses inductive proximity connectors and/or magnetic proximity connectors, where data signals are communicated inductively and/or magnetically between terminals on closely adjacent semiconductor dies 210. Another embodiment conductively couples connectors in adjacent semiconductor dies 210 using an array of solder balls.

While the device 200 (FIG. 2) and the system 300 are illustrated as having a number of components in a given configuration, in other embodiments the device 200 (FIG. 2) and/or the system 300 may include fewer components or additional components. Moreover, two or more components may be combined into a single component and/or a position of one or more components may be changed.

We now describe embodiments of optical components on semiconductor dies that may be included in the MCMs 100 (FIG. 1A) and 130 (FIG. 1B). Existing on-chip metal signal lines often result in large delays, and as technology scales, these delays are increasing. For example, as wire geometries become smaller (thinner, narrower, etc.) they become more resistive. While there are design techniques that can mitigate some of these trends in single-chip systems (for example, using transistors or buffers along long wires to refresh signals), the maximum wire lengths in these systems rarely exceed 2 cm. However, in systems such as MCMs 100 (FIG. 1A) and 130 (FIG. 1B) the maximum wire length is, at least theoretically, unbounded. Consequently, the wire length may be 20 cm, and even though the resulting physical communication channel is routinely broken by proximity communication jumps between components, the latency or delay may be 10 to 20 times larger than that associated with the longest wire in a single chip.

In general, long wire latencies do not restrict the operating frequency in a system. Instead, these latencies may increase the cost of communication within the system. For example, when there are long wire latencies, memories that maintain coherency by snooping on other memories or that operate by casting out scatter or gather requests may be restricted to use a limited set of neighboring memories. In another example, architectures that pipeline communication requests may maintain queues of outstanding requests until these queues are fulfilled. Unfortunately, as communication distances and delays increase, the queues may become larger and larger, increasing the size, the power consumption, and the complexity of the system.

In some embodiments, these problems may be reduced and/or eliminated through the use of on-chip and/or inter-chip optical communication. For example, as discussed previously semiconductor dies 110, 112, and 114 (FIGS. 1A and 1B) and/or bridge chips 116 (FIG. 1B) may include optical waveguides. These waveguides may have widths less than 1 μm and, in some embodiments, may simultaneously carry multiple independent wavelengths, thereby increasing the effective information capacity of each waveguide by the number of independent wavelengths. In an exemplary embodiment, a given waveguide may communicate 32-64 wavelengths.

Note that the speed of light in an optical waveguide is determined by the effective refractive index of the waveguide that is used to confine and communicate the light across the chip or a series of chips. In particular, the speed of light is inversely proportional to this effective refractive index and is essentially c/n, where c is the speed of light in vacuum and n is the effective refractive index of the medium. In general, n has real and imaginary components that depend on wavelength, but for many materials n is a real, non-negative number. For example, for silicon n is approximately 3.5.

In some embodiments, the effective index of a waveguide is reduced by using a so-called 'slotted' waveguide, while still strongly confining and guiding the light. Consequently, the speed of optical signal transmission in these waveguides is in the range of $1-1.8 \times 10^8$ cm/s or up to 10 times the speed of corresponding electrical signals. Furthermore, in some embodiments the delay or latency associated with the waveguides is further reduced using photonic-crystal techniques.

Figure 4A:
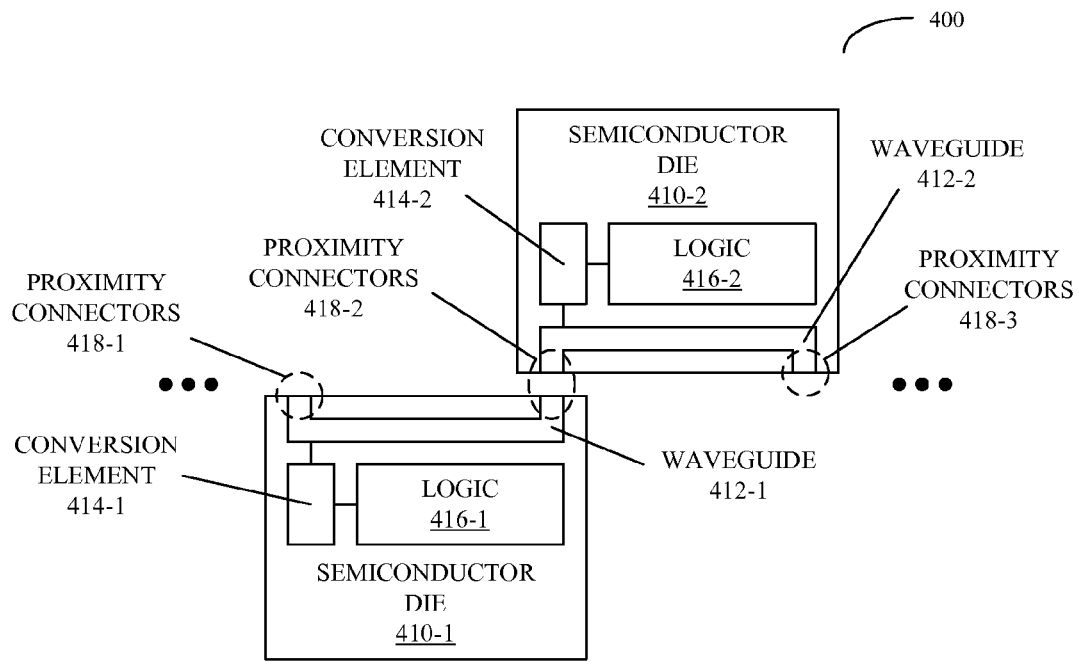
FIG. 4A is a block diagram illustrating a multi-chip module in accordance with an embodiment of the present invention.

FIG. 4A presents a block diagram illustrating an embodiment of an MCM 400. This MCM includes semiconductor dies 410, which include optical waveguides 412 and communicate using optical proximity connectors 418. For example, light may be coupled between the semiconductor dies 410 by: a grating coupler (such as a diffraction grating) embedded in the waveguides 412 (such as the arrayed-waveguide grating discussed below with reference to FIG. 15), a lens, and/or a mirror. Moreover, in some embodiments the optical proximity communication includes evanescent coupling. Note that if the separation between adjacent semiconductor dies is less than a few microns (or a wavelength of the light) additional focusing optics between the semiconductor dies 410 may not be needed. Also note that even single-mode optical waveguides can couple signals across an air gap of these dimensions with minimal loss.

Therefore, in this embodiment proximity communication has been generalized to communication of arbitrary electromagnetic waves across the gap between the semiconductor dies 410. By increasing the frequency of the electro-magnetic waves, optical frequencies are reached, and the electro-magnetic waves are none other than light. Thus, optical proximity communication may be used to communicate information between the semiconductor dies 410, and optical transmission across the semiconductor dies 410 may occur via the waveguides 412. Note that MCM 400 includes an optical signal path or optical control path that spans multiple semiconductor dies 410 without optical-to-electrical conversions or electrical-to-optical conversions at intermediate points.

As noted previously, it may be difficult to perform logical computations (such as determining local flow-control information) in the optical domain. Therefore, in some embodiments the semiconductor dies 410 include conversion elements 414, which convert optical signals to electrical signals (and vice versa). These electrical signals may be coupled to logic circuits 416, such as a local flow-control mechanism or logic that determines local flow-control information based on information from adjacent semiconductor dies 410 and/or flow-control information communicated within a switch. After determining the local flow-control information, the resulting electrical signals may be converted into optical signals using a conversion element (such as conversion element 414-1) and the optical signals may be communicated to other semiconductor dies 410. Alternatively, optical signals corresponding to flow-control information may be received and converted into electrical signals by the conversion element 414-1 prior to setting switching elements on semiconductor die 410-1. Note that the conversion elements 414 may include wavelength combiners and splitters, or may simply tap a percentage of the light as it passes by in the waveguides 412, thereby facilitating conversion from the optical to the electrical domain.

Figure 4B:
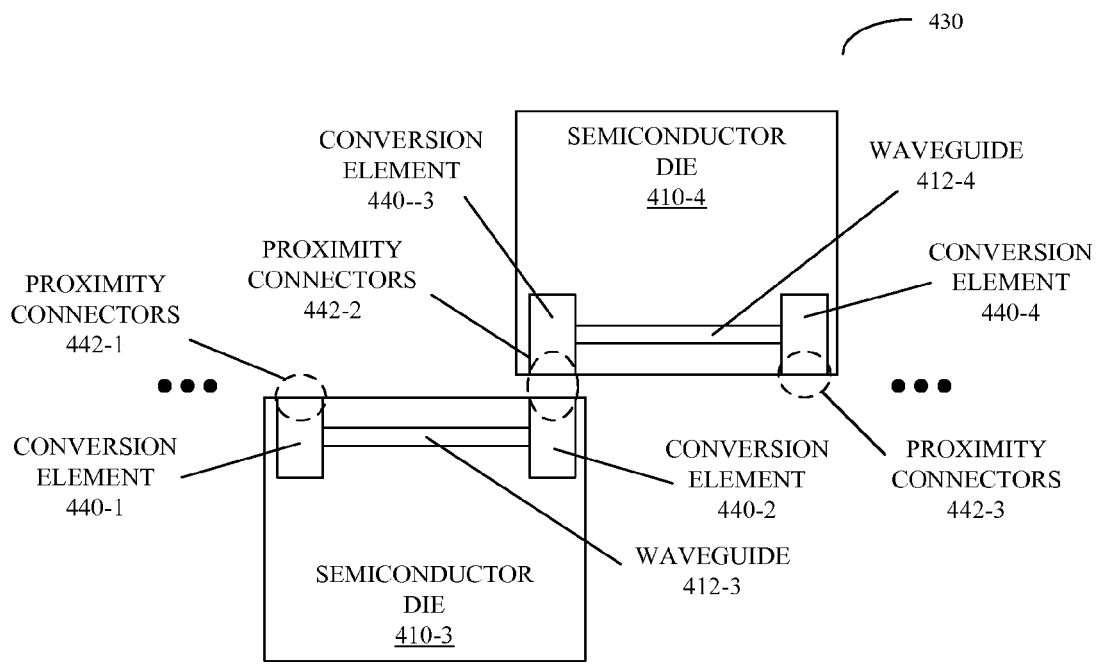
FIG. 4B is a block diagram illustrating a multi-chip module in accordance with an embodiment of the present invention.

While MCM 400 uses optical proximity communication between the semiconductor dies 410, in other embodiments electrical proximity communication is used in conjunction with on-chip optical communication. This is shown in FIG. 4B, which presents a block diagram illustrating an embodiment of an MCM 430. During transmitting, at the interface between the on-chip photonics and proximity connectors 442, the optical signals are converted to electrical signals by conversion elements 440. Similarly, during receiving, at the interface between the proximity connectors 442 and the on-chip photonics, the electrical signals are converted to optical signals by the conversion elements 440.

Note that MCM 400 (FIG. 4A) and MCM 430 may include fewer components or additional components. Moreover, two or more components may be combined into a single component and/or a position of one or more components may be changed.

Figure 5:
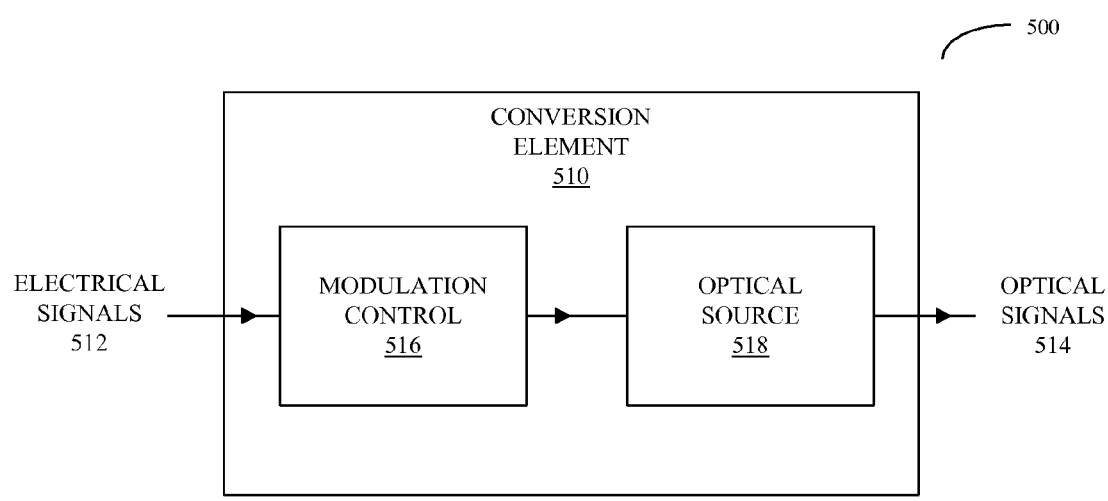
FIG. 5 is a block diagram illustrating a conversion element in accordance with an embodiment of the present invention.

FIG. 5 presents a block diagram illustrating an embodiment 500 of a conversion element 510. Modulation control 516 may modulate an optical source 518 based on electrical signals 512 to produce optical signals 514. Furthermore, while not shown, the modulation control 516 may modulate an optical source 518 based on the optical signals 514 to produce the electrical signals 512. Note that the optical source 518 may include: embedded or integrated lasers or light emitting diodes (LEDs), and/or external lasers or LEDs that are coupled to the semiconductor dies 410 (FIG. 4B). For example, the lasers may include vertical cavity surface-emitting lasers or side-emitting lasers. In some embodiments, erbium amplifiers are used to compensate for on-chip optical losses.

There are several techniques in which electrical signals can be used to create modulated optical signals in conversion element 510. For example, electrically modulated signals (such as amplitude modulated signals corresponding to a logical '1' and a logical '0') can be fed directly to an appropriately biased optical source, such as an LED or laser. Via so-called 'direct' modulation of the optical source, the electrical information can be imposed on the optical output as an optical intensity modulation. Alternatively, electrical modulated signals may be sent to an optical modulator, which has a constant intensity optical beam as an input, and which outputs a modulated intensity optical beam based on the electrically modulated signals. Note that this technique uses two inputs: an electrical modulation signal and an un-modulated optical source.

While these examples illustrate direct and indirect intensity modulation, in other embodiments other types of direct and/or indirect modulation may be used, including: pulse-width modulation, pulse-frequency modulation, pulse-phase modulation, quadrature amplitude modulation, and/or quadrature phase modulation.

Note that the conversion element 510 may include fewer components or additional components. Moreover, two or more components may be combined into a single component and/or a position of one or more components may be changed.

Figure 6A:
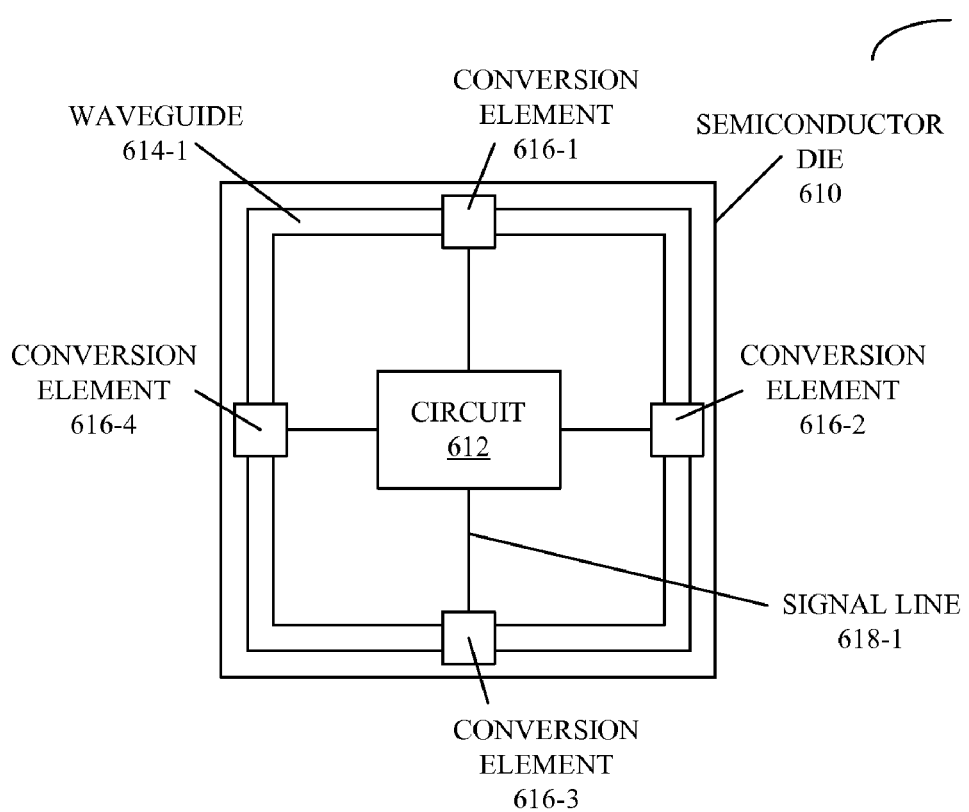
FIG. 6A is a block diagram illustrating a device that includes on-chip optical communication in accordance with an embodiment of the present invention.
Figure 6B:
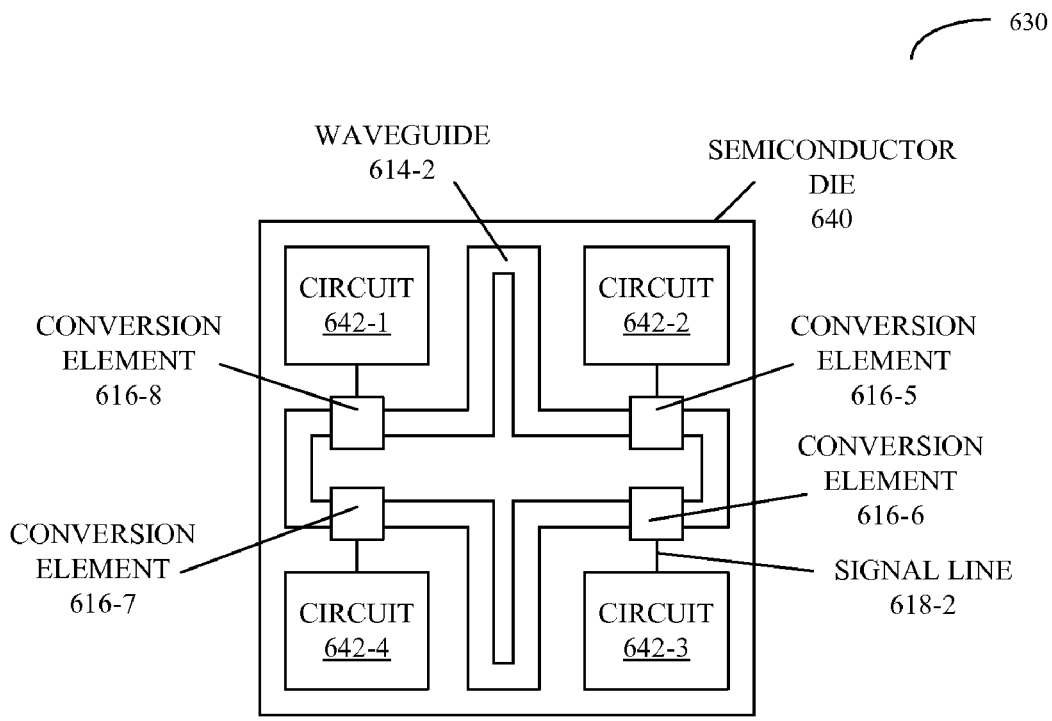
FIG. 6B is a block diagram illustrating a device that includes on-chip optical communication in accordance with an embodiment of the present invention.

FIGS. 6A and 6B present block diagrams illustrating embodiments of devices 600 and 630 that include on-chip optical communication. In these devices, the on-chip photonics include buses (such as waveguides 614) running along the edge and/or across the middle of semiconductor dies 610 and 640. Note that the communication of on-chip and/or inter-chip optical signals may include encoding of information using: time-division-multiple-access, frequency-division-multiple-access, or code-division-multiple-access. For example, communication of the on-chip optical signals may use WDM (such as dense wavelength-division multiplexing and/or coarse wavelength-division multiplexing) to combine different frequencies into a single waveguide (such as the waveguide 614-1). However, in other embodiments there may be a single frequency per waveguide. In either case, the waveguides 614 provide a low-loss, non-radiative communication medium for signaling across the surface of the semiconductor dies 610 and 640. In some embodiments, spatial multiplexing is used when there are multiple parallel channels (such as waveguides 614).

Note that in addition to carrying data and/or flow-control information the semiconductor dies 610 and 640 may also include circuits 612 and 642. For example, these circuits may include a switch or a computer, including a computation core (such as a processor) and/or a storage core (such as memory). Consequently, the photonic networks on each of the semiconductor dies 610 and 640 may also interact with routing points or conversion elements 616 to convert signals from the optical domain to the electrical domain prior to coupling to the circuits 612 and 642 (via signal lines 618), and back again after processing and/or storage.

In some embodiments, the on-chip photonic networks carry one or more synchronization signals in addition to data and/or flow-control information. For example, clock signals may be communicated in an MCM (such as MCM 100 in FIG. 1A and/or MCM 130 in FIG. 1B) with as low a latency as clock signals on a single chip, thereby synchronizing the entire system.

In an exemplary embodiment, data, flow-control information, and/or clock signals are communicated on the waveguides 614 using WDM signaling. Such signaling may be accomplished using optical multiplexers and demultiplexers that are integrated on chip using silicon-on-insulator technology. In addition, the semiconductor dies 610 and 640 may include: arrayed waveguide gratings, ring resonators, and/or Mach-Zander phase modulators.

Note that the semiconductor dies 610 and 640 may include fewer components or additional components. For example, additional components that provide at least some of the previously described functionality may be coupled to semiconductor dies 610 and 640 using flip-chip binding. Moreover, two or more components may be combined into a single component and/or a position of one or more components may be changed.

Figure 7:
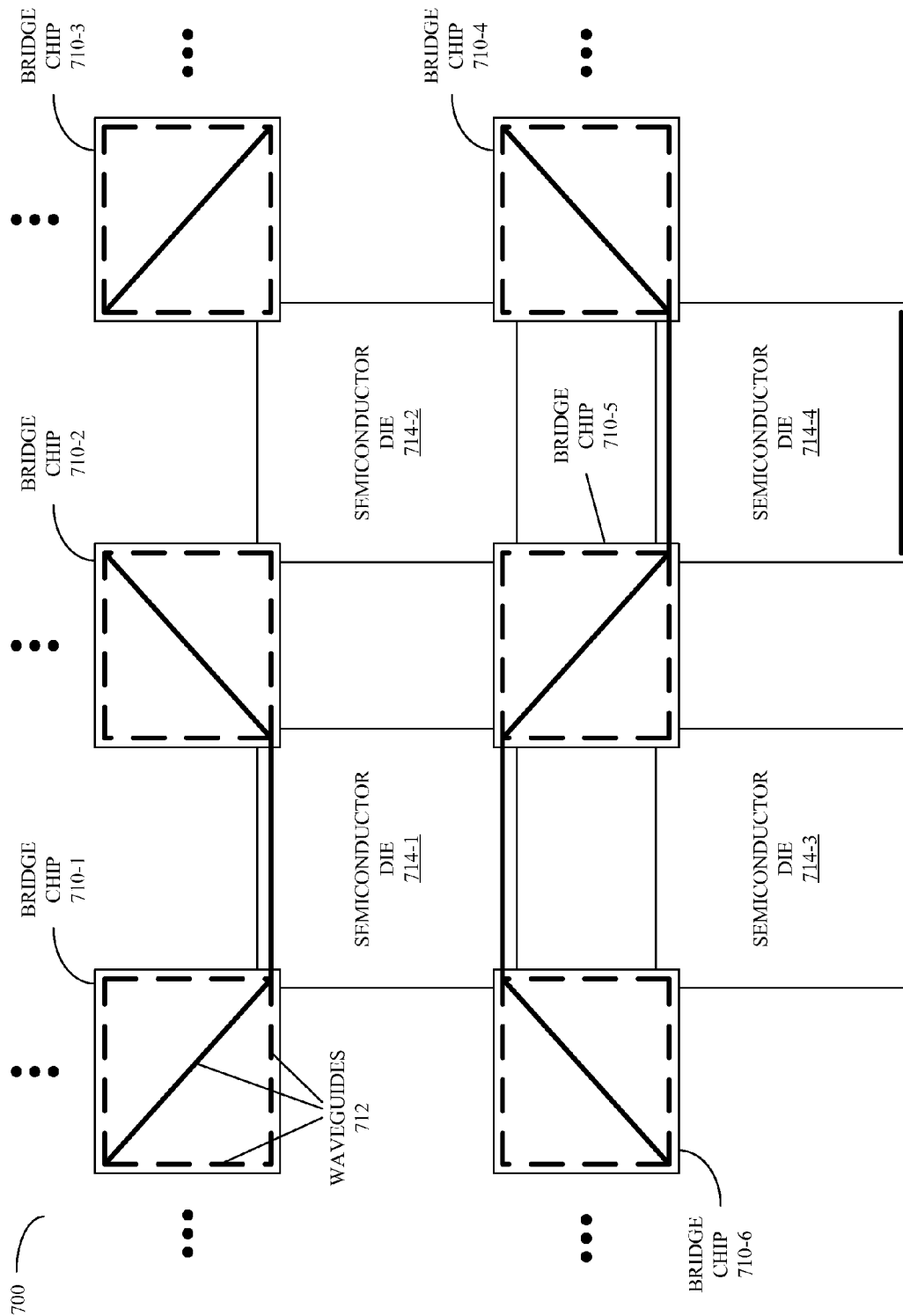
FIG. 7 is a block diagram illustrating a multi-chip module in accordance with an embodiment of the present invention.

We now described embodiments of devices (such as SCMs and MCMs) and systems with reduced inter-chip communication latency. FIG. 7 presents a block diagram illustrating an embodiment of an MCM 700. In this MCM, semiconductor dies 714 are coupled to bridge chips 710. These bridge chips include waveguides 712 (shown as bold dashed or solid lines) that span multiple components (such as multiple bridge chips 710 and/or semiconductor dies 714). In an exemplary embodiment, waveguides 712 include optical-bypass waveguides that facilitate communication of optical signals between semiconductor dies that are separated by at least one intervening semiconductor die without intermediate processing of electrical signals associated with the optical signals on the intervening semiconductor die. For example, the optical signals may be communicated from a first semiconductor die to a second semiconductor die via optical proximity communication. Next, the optical signals may be communicated through the second semiconductor die via an optical-bypass waveguide (which may bypass any control logic on the second semiconductor die). Then, the optical signals may be communicated from the second semiconductor die to a third semiconductor die via optical proximity communication.

A given semiconductor die in MCM 700, such as semiconductor die 714-1, may include a conversion element (such as a laser or a diode) to convert electrical signals to optical signals, which are transmitted on the optical-bypass waveguides. Similarly, the given semiconductor die may include another conversion element (such as a detector or a diode) to convert the optical signals to the electrical signals (if the given semiconductor die is the destination of the optical signals). More generally, the given semiconductor die may include one or more add-drop elements (such as add or drop waveguides) which are configured: to insert the optical signals onto the optical waveguide(s) 712 (for example, using the conversion element); to remove the optical signals from the optical waveguide(s) 712 (for example, using the other conversion element), and/or to allow the optical signals to pass through the given semiconductor die on the optical waveguide(s) 712.

In some embodiments, the one or more add-drop elements convert a portion of the optical signals in the waveguides 712 to determine if the given semiconductor die is the destination of the optical signals (for example, based on routing information or a header associated with data packets in the optical signals). If yes, the remainder of the optical signals may be converted to electrical signals, and if no, the remainder of the optical signals may pass through the given semiconductor die without processing.

However, in some embodiments the optical signals are encoded (for example, using frequency-division multiplexing and/or WDM) and one or more sub-channels correspond to the given semiconductor die. In these embodiments, the one or more add-drop elements convert the optical signals corresponding to the one or more sub-channels (such as those associated with one or more carrier wavelengths) to electrical signals and the remainder of the optical signals pass through the given semiconductor die without processing.

By using all-optical bypass channels, MCM 700 may facilitate low-latency optical communication between semiconductor dies 714. In particular, signal propagation in optical waveguides may be 5-10× faster than signal propagation on existing on-chip metal wires. Moreover, optical waveguides may not require repeaters (i.e., optical-to-electrical signal conversion and back) on the semiconductor dies 714 and at every coupling between the semiconductor dies 714. Instead, electrically driven optical amplifiers and/or erbium amplifiers may be used to compensate for optical losses without conversion to the electrical signal domain. Moreover, multiple optical signals traversing one or more of the waveguides 712 on separate wavelengths may be simultaneously amplified so long as the wavelengths fall within the amplification band of the amplifier(s). In an exemplary embodiment, such amplifiers occur every few cm along the length of the waveguides 712 (or an associated optical signal path) and/or at every few couplings between semiconductor dies 714.

In some embodiments, optical signals on the all-optical bypass channels are encoded using WDM. Consequently, in some embodiments, a single waveguide provides bandwidth densities that are an order of magnitude greater than in existing electrical interconnects. In an exemplary embodiment, a single waveguide carries up to Terabits per second of bandwidth and the use of all-optical bypass channels between semiconductor dies 714 facilitates inter-chip communication at these bandwidths with: reduced power dissipation, reduced area utilization, and reduced latency.

Note that MCM 700 may include fewer components or additional components. For example, in addition to the full-row waveguides MCM 700 may include full-column waveguides, and these waveguides may support bidirectional communication In some embodiments, semiconductor dies 714 are interconnected by linear or mesh-like arrays of all-optical bypass channels. Furthermore, in some embodiments, the MCM 700 includes a 1-dimensional chain of semiconductor dies 714 (or CMs) and/or a 2-dimensional array of semiconductor dies 714 (or CMs). Note that two or more components in MCM 700 may be combined into a single component and/or a position of one or more components may be changed.

Figure 8:
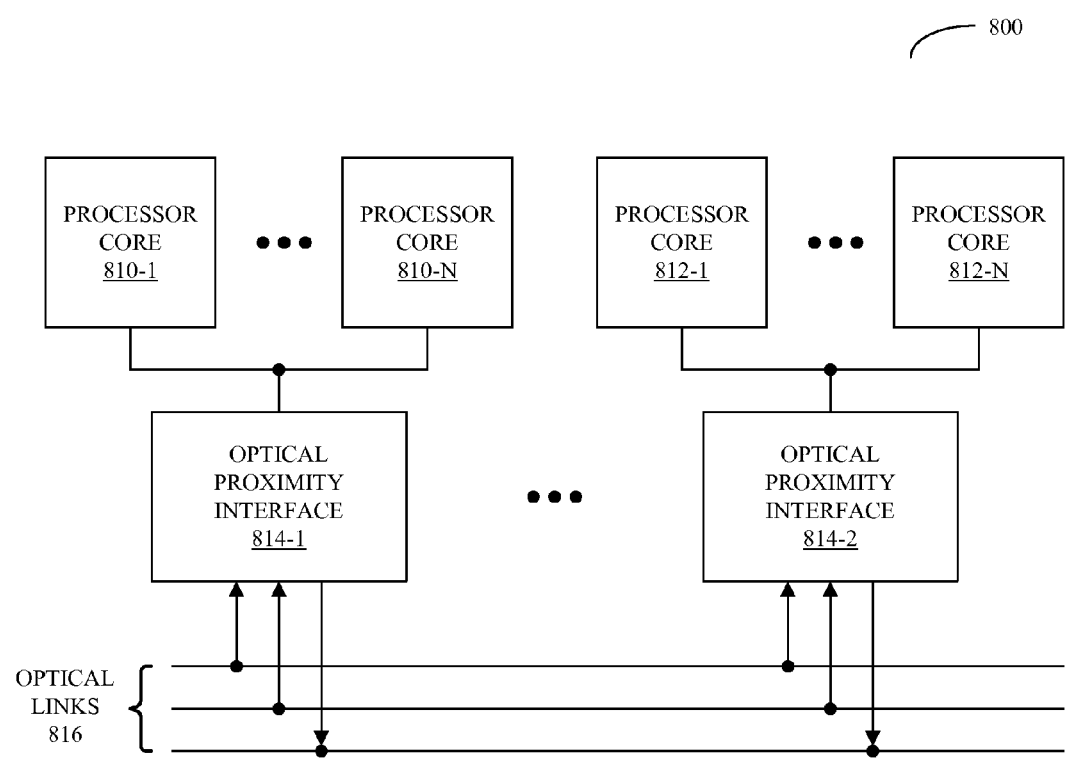
FIG. 8 is a block diagram illustrating a multi-chip module in accordance with an embodiment of the present invention.

FIG. 8 presents a block diagram illustrating an embodiment of an MCM 800. This MCM shows a dense cache-coherent multiprocessor system implemented using a mesh of optical waveguides. In particular, groups of processor cores 810 and 812 are coupled to optical signal paths or optical links 816 (which include the optical waveguides) through optical proximity interfaces 814. Each of the optical proximity interfaces 814, such as optical proximity interface 814-1, may support one or more waveguides with each waveguide carrying numerous (e.g., up to 72) wavelengths, and with each wavelength channel supporting multiple Gigabit per second of data transmission (e.g., up to 40 Gbps). Consequently, the data transmission density of the optical proximity interfaces 814 may exceed 100 Tbps/mm$^2$.

Note that MCM 800 may include fewer components or additional components. Moreover, two or more components may be combined into a single component and/or a position of one or more components may be changed.

Figure 9:
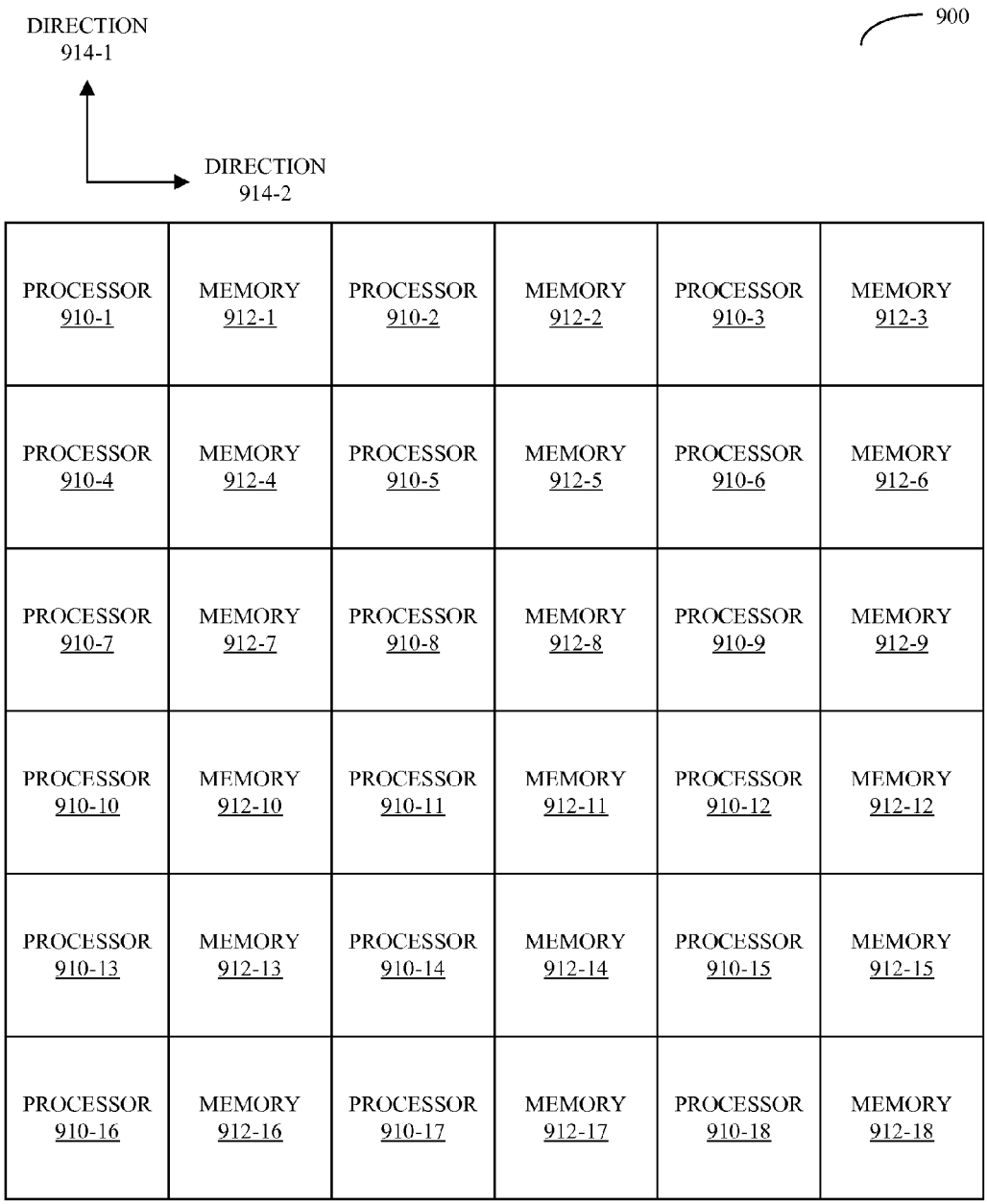
FIG. 9 is a block diagram illustrating a multi-chip module in accordance with an embodiment of the present invention.

FIG. 9 presents a block diagram illustrating an embodiment of an MCM 900. This MCM extends the cache-coherent multiprocessor architecture using optical waveguides shown in FIG. 8. In particular, each row and column in an array of alternating processors 910 and memory 912 (such as cache memory) may have an associated optical signal path or all-optical bypass channel, such as the full-row waveguides in FIG. 7. Thus, components in the MCM 900 may communicate with each other along two orthogonal directions 914. These optical signal paths may be independent (such as multiple linear buses, which may be coupled end to end) or may be part of a single communication bus (such as a toroid). Moreover, subsets of the MCM 900 may have even higher connectivity.

Note that MCM 900 may include fewer components or additional components. Moreover, two or more components may be combined into a single component and/or a position of one or more components may be changed.

Figure 10:
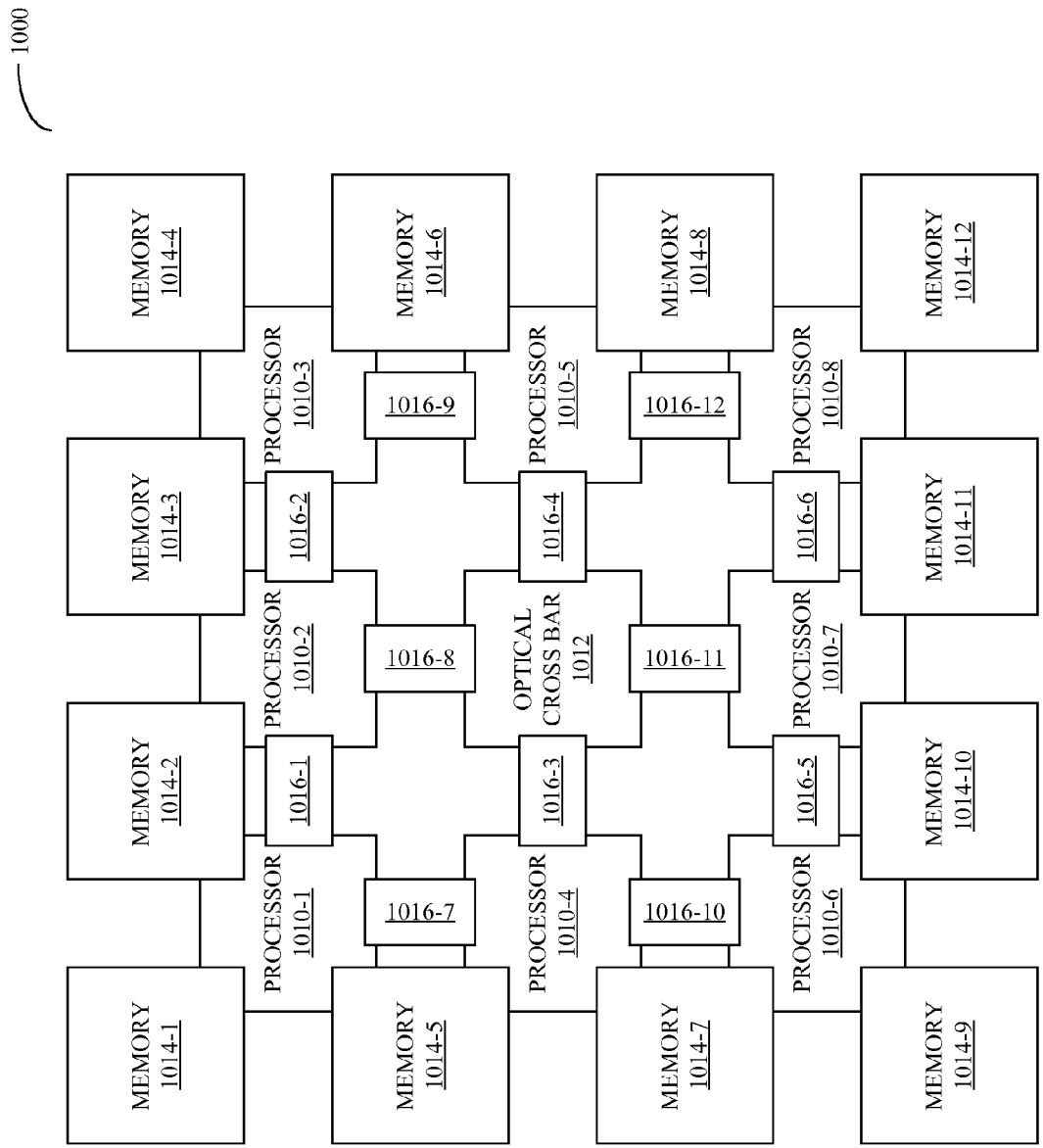
FIG. 10 is a block diagram illustrating a multi-chip module in accordance with an embodiment of the present invention.

FIG. 10 presents a block diagram illustrating an embodiment of an MCM 1000, which includes an optical cross-bar 1012 switch. This switch is coupled to eight processor 1010 by bridge chips 1016, and the processors 1010 are coupled to a perimeter of memory 1014 chips (such as cache memory). Note that signals flow through the optical cross bar 1012 and then bridge chips 1016 distribute these signals to the processors 1010 and memory 1014 using electrical proximity communication and/or optical proximity communication.

Note that MCM 1000 may include fewer components or additional components. Moreover, two or more components may be combined into a single component and/or a position of one or more components may be changed.

We now described embodiments of one or more optical signal paths, and in particular, optical signal paths that communicate optical signals which are encoded using WDM. These techniques may facilitate low latency inter-chip communication using a limited number of waveguides, as well as a limited number of sources (such as lasers), and detectors, thereby reducing power consumption.

Figure 11:
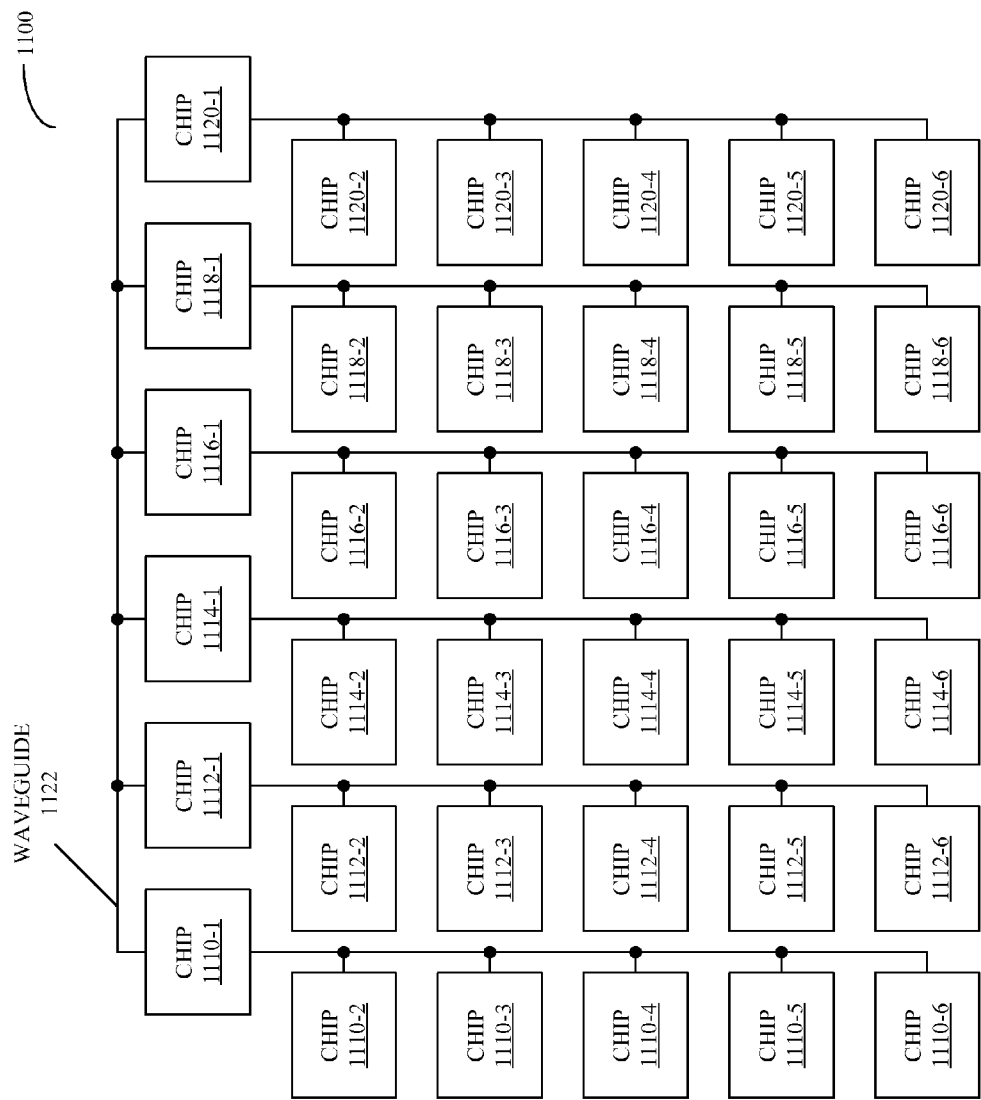
FIG. 11 is a block diagram illustrating a multi-chip module in accordance with an embodiment of the present invention.

FIG. 11 presents a block diagram illustrating an embodiment of an MCM 1100. This MCM includes thirty-six chips (such as semiconductor dies 714 in FIG. 7) arranged in a 2-dimensional array, including columns with chips 1110, 1112, 1114, 1116, 1118, and 1120. These chips are coupled by optical waveguides, which communicate optical signals that are, at least in part, encoded based on wavelength (for example, using WDM). In particular, chips 1110-1, 1112-1, 1114-1, 1116-1, 1118-1, and 1120-1 are coupled together by a waveguide 1122, and chips in a given column (such as chips 1110) are coupled together by an additional waveguide. These waveguides may facilitate point-to-point communication between the chips and may provide equal incoming and outgoing data bandwidths.

Coding, such as WDM, may be used to determine where an optical signal has come from and/or where an optical signal is going to, thereby eliminating electrical processing of flow-control information or packet headers at intermediate chips in an optical signal path. For example, a given column (or sub-set) of the chips may be associated with a given sub-channel (such as a range of wavelengths centered on a carrier wavelength or a group of wavelengths each centered on associated carrier wavelengths) and chips within this column may communicate using this sub-channel. Thus, in MCM 1100 a set of N carrier wavelengths may be used, and a given column (such as chips 1110) may utilize a sub-channel associated with a given carrier wavelength in this set.

In an exemplary embodiment, N is 6, i.e., the set of carrier wavelengths includes $\lambda_1$, $\lambda_2$, $\lambda_3$, $\lambda_5$ and $\lambda_6$. An optical signal may be first communicated in a horizontal direction via waveguide 1122 to reach a target column within the MCM 1100. Then, the optical signal may be sent to its destination(s) within the target column. In particular, because a different carrier wavelength is used to send optical signals to different columns, splitters or filters at each chip along the waveguide 1122 can remove optical signals having the appropriate wavelengths while other optical signals are unaffected. Thus, if a transmission targeting chips 1110 uses carrier wavelength $\lambda_1$, the corresponding optical signals can be tapped out of the waveguide 1122 at chip 1110-1. Similarly, if transmissions targeting chips 1112 use carrier wavelength $\lambda_2$, the corresponding optical signals can be tapped out at chip 1112-1.

Note that if the linear dimension of the array exceeds the number of carrier wavelengths that can be used in waveguide 1122, multiple waveguides may be used. For example, if a single waveguide can concurrently carry eight carrier wavelengths, a 16×16 array may use at least two horizontal waveguides to couple the columns or subsets of chips.

Figure 12:
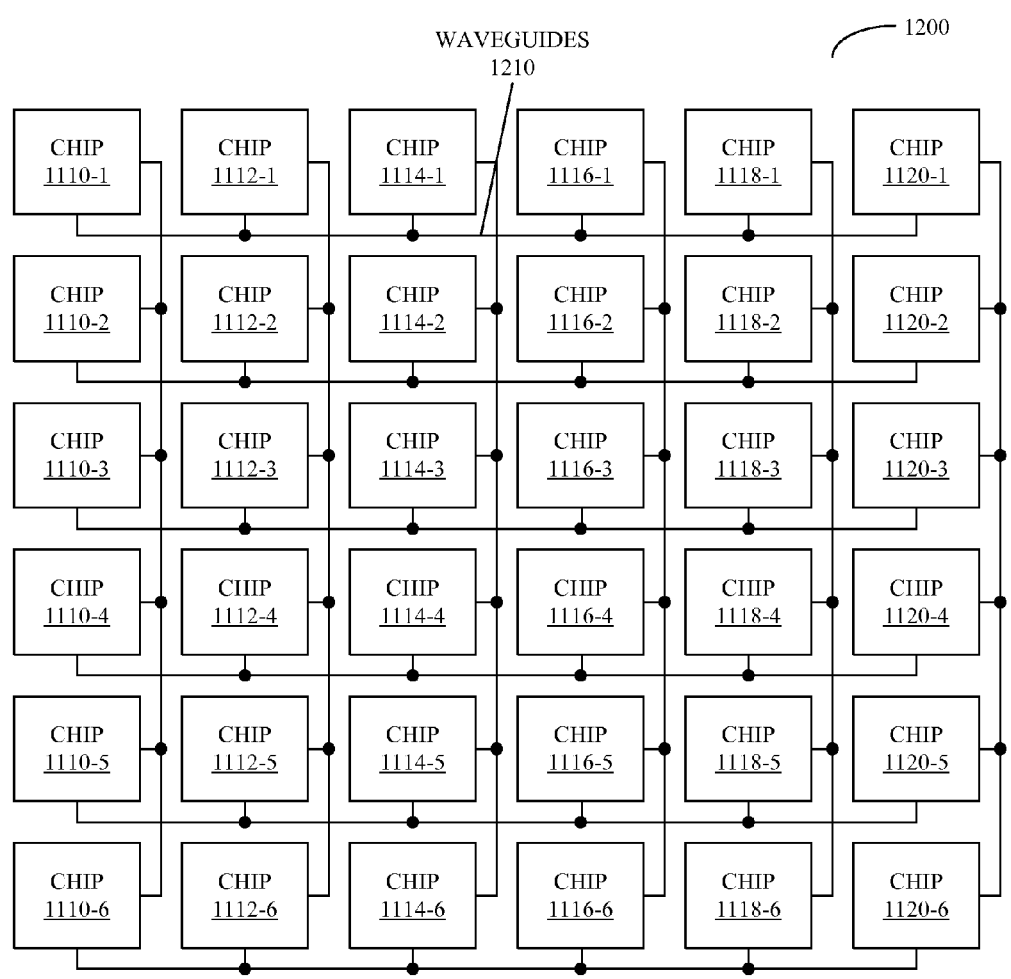
FIG. 12 is a block diagram illustrating a multi-chip module in accordance with an embodiment of the present invention.

An extension of this approach allows multiple chips to be specified during transmission while using a common waveguide. This is shown in FIG. 12, which presents a block diagram illustrating an embodiment of an MCM 1200 that includes chips coupled by waveguides 1210. In this MCM, a given chip in a given column and/or a given row is associated with a given carrier wavelength (and thus a given sub-channel) in the set of N carrier wavelengths. By performing a circular permutation on the carrier wavelengths in the set N, each chip in the given column and/or a given row can be assigned a different carrier wavelength. Consequently, a given waveguide in the waveguides 1210 can communicate optical signals coming from and going to different chips without the optical signals interfering with each other.

In an exemplary embodiment, N is 6, i.e., the set of carrier wavelengths includes $\lambda_1$, $\lambda_2$, $\lambda_3$, $\lambda_4$, $\lambda_5$ and $\lambda_6$. Moreover, chips in the MCM 1200 may be associated with carrier wavelengths based on the following array of permutations $$\begin{matrix} \lambda_1 & \lambda_2 & \lambda_3 & \lambda_4 & \lambda_5 & \lambda_6 \\ \lambda_6 & \lambda_1 & \lambda_2 & \lambda_3 & \lambda_4 & \lambda_5 \\ \lambda_5 & \lambda_6 & \lambda_1 & \lambda_2 & \lambda_3 & \lambda_4 \\ \lambda_4 & \lambda_5 & \lambda_6 & \lambda_1 & \lambda_2 & \lambda_3 \\ \lambda_3 & \lambda_4 & \lambda_5 & \lambda_6 & \lambda_1 & \lambda_2 \\ \lambda_2 & \lambda_3 & \lambda_4 & \lambda_5 & \lambda_6 & \lambda_1 \end{matrix}.$$

Thus, in row 1 or column 1, chip 1110-1 may be uniquely specified using carrier wavelength $\lambda_1$, and in row 2 or column 3 chip 1114-2 may be uniquely specified using carrier wavelength $\lambda_2$, etc.

More generally, an array of chips (such as the MCM 1200) may include N subsets, each of which includes M chips. For a given chip in the MCM 1200, a first optical signal path (such as a waveguide) may be coupled to the other chips within a given subset. Communication with a particular one of these chips may utilize a carrier wavelength in a set of M carrier wavelengths. Moreover, the given chip may also be coupled to other subsets via a second optical signal path (such as another waveguide). Communication with a particular one of these subsets may utilize a carrier wavelength in a set of N carrier wavelengths.

Figure 13:
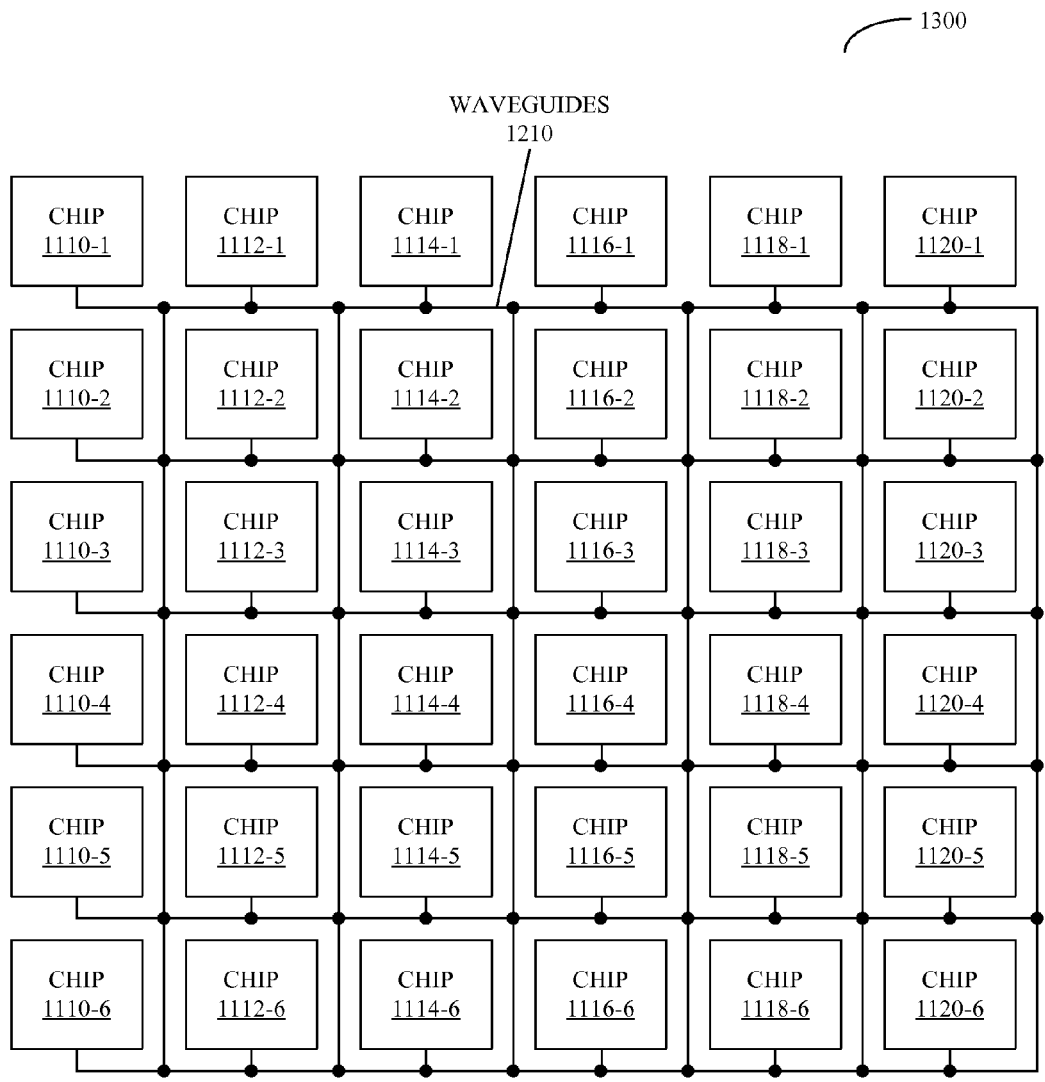
FIG. 13 is a block diagram illustrating a multi-chip module in accordance with an embodiment of the present invention.

Further generalizing this approach, each chip in an array may be specified by a unique carrier wavelength. Thus, each row and each column may have a unique set of carrier wavelengths. This is shown in FIG. 13, which presents a block diagram illustrating an embodiment of an MCM 1300. In general, an MCM includes N subsets of chips, each of which includes M chips. In MCM 1300, N and M both equal 6. Thus, chips in the MCM 1300 communicates with a given chip using a given carrier wavelength in a set of N×N carrier wavelengths.

In a variation on this embodiment, each column in MCM 1300 may be coupled to each row by a separate waveguide. This may reduce the total number of carrier wavelengths at the cost of additional waveguides. For example, a waveguide may couple column 1 with row 4. Similar, but independent waveguides may couple optical signals from column 1 to the other rows. In general, in this embodiment, for an N×N array, a given chip has N outgoing waveguides each communicating optical signals using N carrier wavelengths. The specific choice of waveguide and carrier wavelength, respectively, determines the row and column of the recipient chip. In some embodiments, there are also N incoming waveguides to the given chip.

Figure 14:
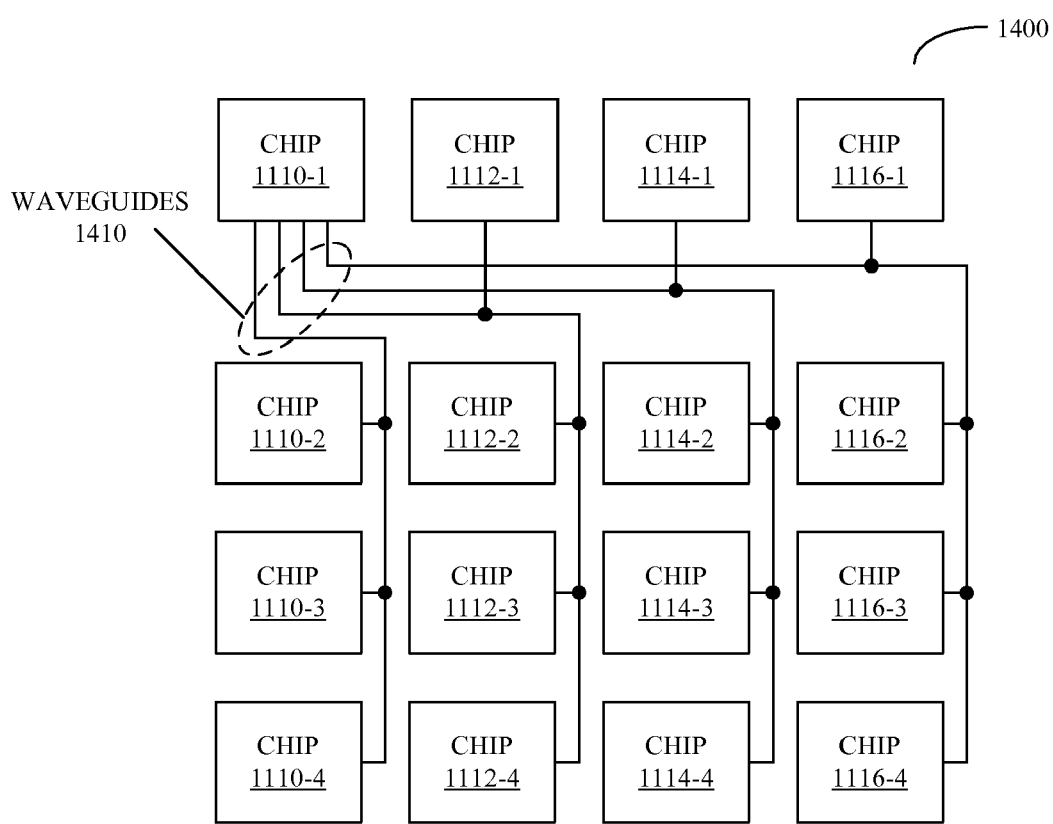
FIG. 14 is a block diagram illustrating a multi-chip module in accordance with an embodiment of the present invention.

In a further variation, a given chip in the array is coupled to different subsets of chips using separate waveguides. This is shown in FIG. 14, which presents an illustration of an embodiment of an MCM 1400. In this MCM, chip 1110-1 is coupled to subsets of chips by separate waveguides 1410. For a given waveguide, a particular chip is specified by a given carrier wavelength in a set of N carrier wavelengths. Note that in this embodiment, N is 4.

In an exemplary embodiment, chip 1110-1 communicates optical signals to other chips in row 1 using carrier wavelength $\lambda_1$ and communicates optical signals to other chips in row 2 using carrier wavelength $\lambda_2$, etc. Thus, optical signals to chip 1112-1 may be communicated using a first waveguide in the waveguides 1410 via a sub-channel associated with carrier wavelength $\lambda_1$. Similarly, optical signals to chip 1114-1 may be communicated using a second waveguide in the waveguides 1410 via the sub-channel associated with carrier wavelength $\lambda_1$.

In the general case, an array includes N subsets of chips, each of which includes M chips. Chips within a given subset are coupled by a separate optical signal path, such as a waveguide. Moreover, a give chip communicates with a particular chip in the given subset using optical signals in a sub-channel on the separate optical signal path, which is associated with a given wavelength in a set of M wavelengths.

Inter-chip communication using optical signal paths to communicate optical signals that are, at least in part, encoded using WDM have several advantages. In particular, these techniques facilitate minimum-distance, point-to-point communication between chips with a manageable number of optical signal paths (such as waveguides) per chip. For example, there may be N outgoing and/or N coming waveguides for each chip in a N×N array, and N carrier wavelengths may be sent and/or received at each chip. By using such dedicated optical signal paths to communicate optical signals between any pair of chips, flow-control and collision-detection control logic may be reduced or eliminated because the sender and/or destination chip is determined by the waveguide and/or carrier wavelength used. This arrangement may ensure that the incoming/outgoing data bandwidth is balanced and that an array of chips is isomorphic (symmetric) at any location, which may reduce the number of components in the array. Note that these techniques and configurations can coexist with other communication techniques and/or networks in the same MCM, for example, a tree network can be embedded in the array of chips to support global operations, such as broadcasts or barriers.

Note that MCM 1100 (FIG. 11), MCM 1200 (FIG. 12), MCM 1300 (FIG. 13), and/or MCM 1400 may include fewer components or additional components. For example, there may be fewer or additional waveguides coupling chips to each another. Moreover, two or more components may be combined into a single component and/or a position of one or more components may be changed.

Optical signals that are encoded using WDM may be multiplexed onto and/or de-multiplexed from the optical signal paths (such as the waveguides) using a variety of techniques and optical coupling elements, including: a lens, a diffraction grating, a mirror, and/or an arrayed-waveguide grating. Arrayed-waveguide gratings are capable of precise multiplexing/de-multiplexing of multiple sub-channels traveling in a waveguide with relatively low losses. For example, the multiple sub-channels can be de-multiplexed into separate waveguides, each of which carries a sub-channel associated with a single carrier wavelength.

Figure 15:
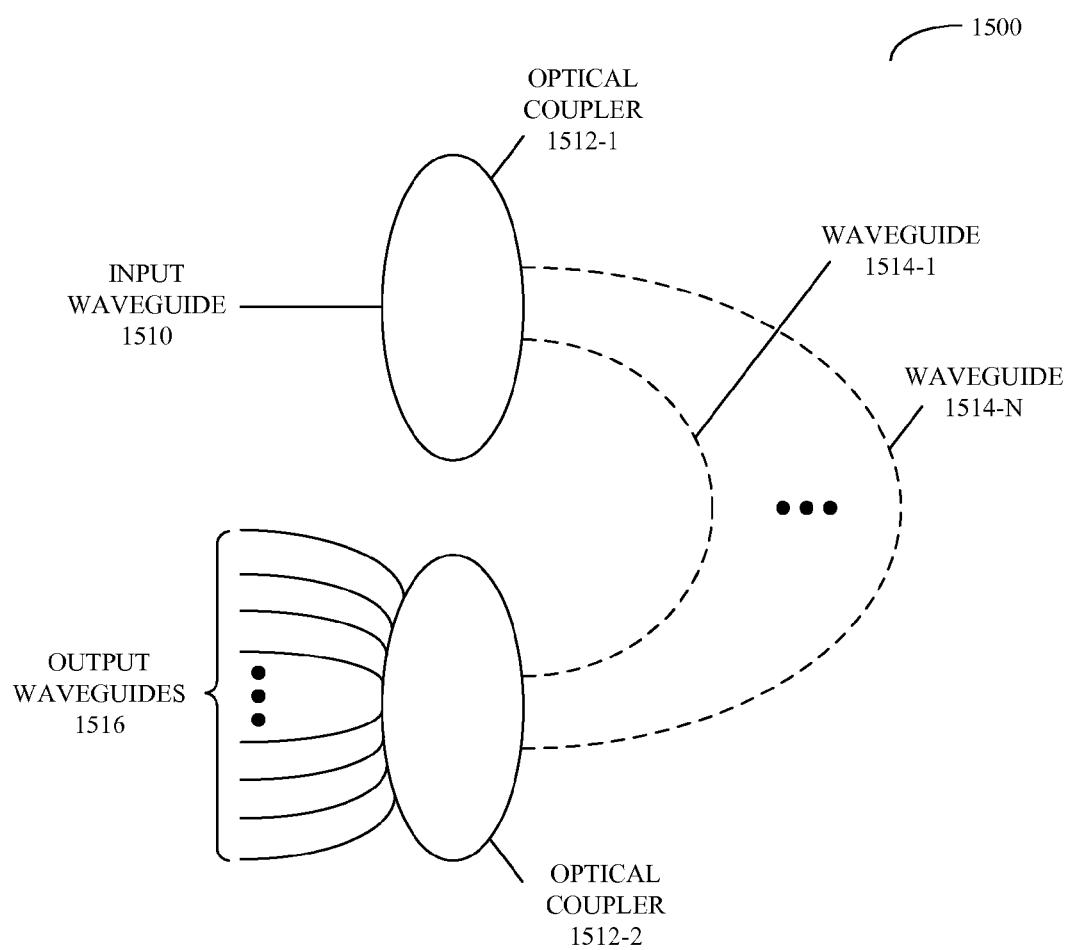
FIG. 15 is a block diagram illustrating an arrayed-waveguide grating in accordance with an embodiment of the present invention.

FIG. 15 presents a block diagram illustrating an embodiment of an arrayed-waveguide grating 1500. This arrayed-waveguide grating includes two optical couplers 1512, such as two slab-waveguide star couplers, which are coupled to a dispersive set of waveguides 1514. During operation as a de-multiplexer, light propagating in an input waveguide 1510 is coupled into the waveguides 1514 via optical coupler 1512-1. These waveguides are designed such that the optical path length difference between adjacent waveguides in the waveguides 1514 equals an integer multiple of the central carrier wavelength of the de-multiplexer. Consequently, the field distribution at the input aperture will be reproduced at the output aperture. Therefore, at this carrier wavelength, the light focuses in the center of the image plane, provided that the input waveguide 1510 is centered in the input plane.

However, if an input wavelength is detuned from this central carrier wavelength, a phase changes will occur in the different waveguides 1514. Because of the constant path length difference between adjacent waveguides in the waveguides 1514, this phase change will increase linearly from the inner waveguide to the outer waveguide in the waveguides 1541. Consequently, the resulting wavefront will be tilted at the output aperture and the focal point in the image plane will be shifted away from the center. By appropriately positioning output waveguides 1516 in the image plane, different carrier wavelengths (or spatial frequencies) can be spatially separated. Note that by reversing the direction of propagation of the light, i.e., by reversing the input and output, the arrayed-waveguide grating 1500 may be used as a multiplexer.

Arrayed-waveguide grating have additional properties that may be of use in the interconnect topologies described above. For example, if additional wavelengths are available for use in an MCM, then the wrap-around property of the arrayed-waveguide grating can be used. In particular, the free spectral range of an arrayed-waveguide grating is defined as the frequency shift for which the phase-shift, $\Delta\Phi$, equals $2\pi$. Two frequencies separated by the free spectral range that are input into an arrayed-waveguide-grating de-multiplexer will focus and leave though the same output waveguide, because their phase at the output waveguides 1516 is the same. Thus, if additional sub-channels are available in an MCM, multiple carrier wavelengths separated by the free spectral range can be assigned to the same waveguide destined for a particular chip. Moreover, because these carrier wavelengths are widely spaced, it may be easier to distinguish between these carrier wavelengths on the particular chip with less sensitivity to crosstalk and/or temperature.

Another useful property of arrayed-waveguide gratings is the ability to automatically shuffle the carrier wavelengths, as described above with reference to FIG. 12. In particular, if there are multiple input waveguides and output waveguides, then an arrayed-waveguide grating can be designed so that there is a circular property of carrier-wavelength assignments between input waveguides and output waveguides. This shuffling can occur in a single device or chip, which can significantly reduce the number of separate multiplexers and de-multiplexers, and thus, can reduce the loss associated with a given sub-channel.

Note arrayed-waveguide grating 1500 may include fewer components or additional components. For example, in embodiments that utilize dense wavelength-division multiplexing, there may be a temperature controller that stabilizes the temperature of the arrayed-waveguide grating 1500 to within a few C. Moreover, two or more components may be combined into a single component and/or a position of one or more components may be changed.

In exemplary embodiments, combinations of encoding techniques and communication channels may be used to achieve a target bandwidth capacity. Each configuration may have unique advantages for a given application. For example, 2.5 Gbps channel data rates can be extended to 40 Gbps using time-domain multiplexing (such as encoding using time-division-multiple-access) of electrical signals and data rates greater than 100 Gbps may be achieved using time-domain multiplexing of optical signals. As noted previously, data rates greater than 1 Tbps may be achieved by wavelength multiplexing several such channels using dense wavelength-division multiplexing and/or coarse wavelength-division multiplexing. Alternatively, a data rate of 1 Tbps may be achieved by multiplexing 1 Gbps time-domain multiplexed channels to a moderate number of SCM channels (e.g. 32) and then either multiplexing these channels onto parallel fibers (or waveguides) or using dense wavelength-division multiplexing.

Figure 16:
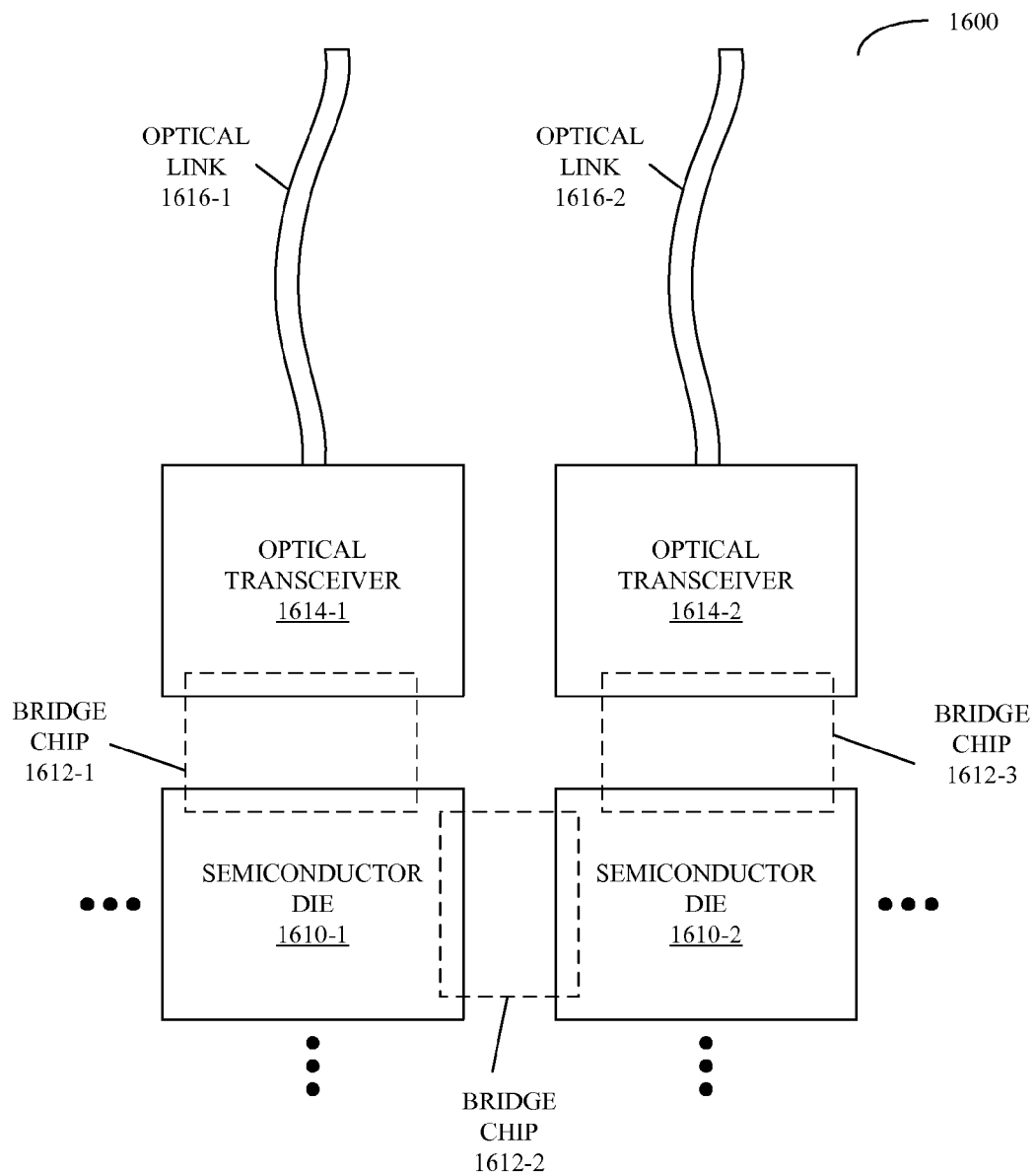
FIG. 16 is a block diagram illustrating a multi-chip module in accordance with an embodiment of the present invention.

To match the high bandwidth of an MCM that uses proximity communication, a high bandwidth I/O technology may be used to communicate data (such as data units) to and/or from the MCM. Fiber optic links are one such technology. FIG. 16 presents a block diagram illustrating an embodiment of an MCM 1600 that includes semiconductor dies 1610 coupled to optical transceivers 1614 using electrical proximity communication and/or optical proximity communication and bridge chips 1612. Note that the optical transceivers 1614 are coupled to optical links 1616, such as optical fibers. In some embodiments, these optical links 1616 may use WDM, such as dense wavelength-division multiplexing. In some embodiments, the optical transceivers 1614 and optical links 1616 are external to the MCM 1600. However, in other embodiments the optical transceivers 1614 and/or optical links 1616 are internal to the MCM 1600.

In some embodiments, one or more of the optical transceivers 1614 may convert optical signals received using one or more of the optical links 1616 into electrical signals. These signals may be communicated within the MCM 1600 using electrical proximity communication. In addition, one or more of the optical transceivers 1614 may convert electrical signals from the MCM 1600 into optical signals that are transmitted on one or more of the optical links 1616. Note that the transceivers 1614 may include conversion elements, such as conversion elements 440 (FIG. 4B) and/or conversion element 510 (FIG. 5).

Figure 17:
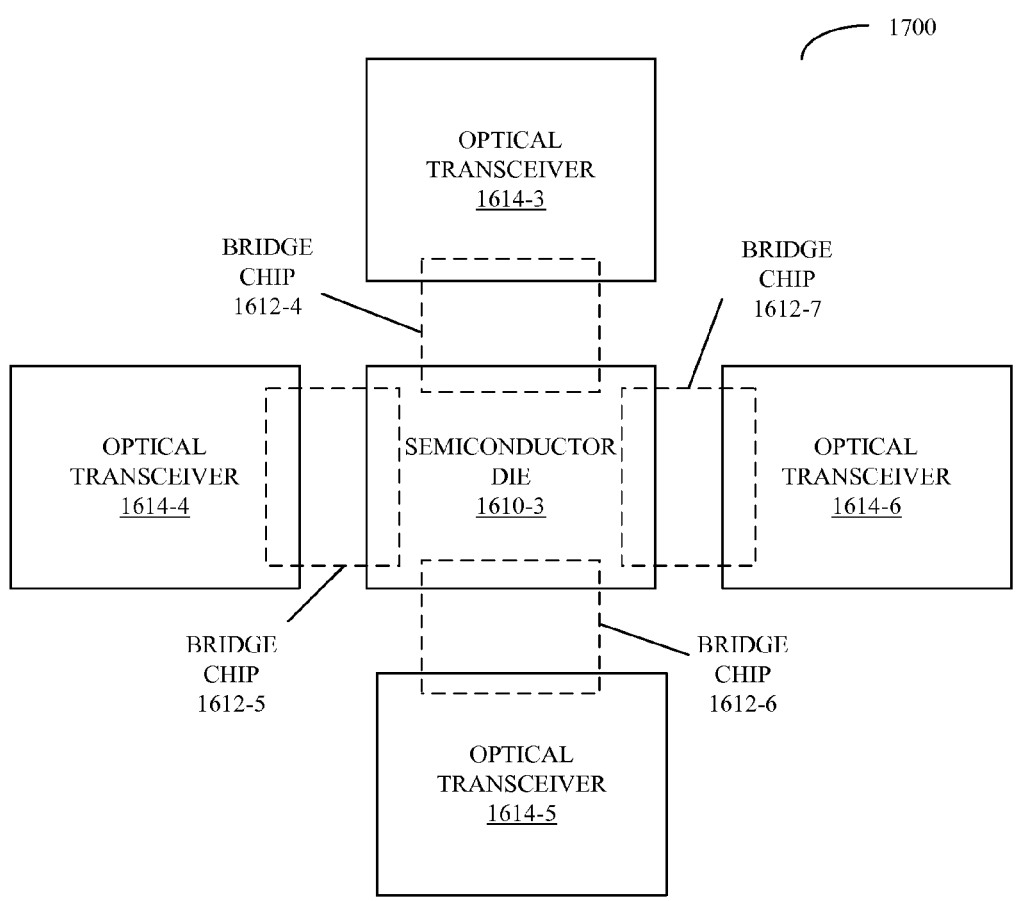
FIG. 17 is a block diagram illustrating a multi-chip module in accordance with an embodiment of the present invention.

In some embodiments, an MCM includes a semiconductor die and one or more optical transceivers. This shown in FIG. 17, which presents a block diagram illustrating an embodiment of an MCM 1700 that includes a semiconductor die 1610-3 coupled to optical transceivers 1614 using electrical proximity communication and/or optical proximity communication and bridge chips 1612. Note that the optical transceivers 1614 are coupled to optical links (not shown).

Note that MCMs 1600 (FIG. 16) and/or 1700 may include fewer components or additional components. For example, one or more optical transceivers 1614 may be integrated onto the semiconductor dies 1610 (FIG. 16) and/or 1610-3. Moreover, two or more components may be combined into a single component, and the position of one or more components may be changed.

We now describe another embodiment of an MCM. Recall that optical waveguides offer lower latency and higher bandwidth (for example, by using WDM). However, unbundling of information (for example, demultiplexing of information associated with different carrier frequencies or wavelengths) in an architecture with multiple repeaters in an optical signal path may: increase power consumption, area utilization, and/or latency. Consequently, the use of an MCM with add/drop ports to add or drop a portion of the optical information sourced by or destined for a specific semiconductor die in the MCM may facilitate high-density, high-bandwidth, and/or low-latency systems.

For example, each optical interface, which may be based on optical proximity communication, may support one or more waveguides. Moreover, each waveguide may convey numerous (e.g., up to 72) wavelengths, with each wavelength channel supporting multi-Gbps (e.g., up to 40 Gbps) data communication. Therefore, the data communication density of these optical interfaces may exceed 100 Tbps/mm$^2$.

There are several challenges associated with such an MCM. In particular, there is often only a single waveguide routing layer available in systems based on silicon photonics because there is typically only one silicon transistor layer available in CMOS manufacturing facilities. Consequently, the routing of optical signals often occurs in a single optical layer (or substantially in a single optical layer) on a silicon chip.

Moreover, there are also challenges associated with loss and crosstalk in on-chip waveguides. For example, a narrow ridge waveguide with a diameter less than 1 μm can communicate optical signals, including those with high-speed modulation of carrier frequencies or wavelengths. However, this type of waveguide typically has larger losses than waveguides with diameters substantially larger than 1 μm. Moreover, there is an inverse relationship between the diameter of the waveguide and the crosstalk that occurs at a crossing or intersection of two or more waveguides. Consequently, it can be difficult to achieve high bandwidth density while simultaneously achieving low loss and low crosstalk between intersecting waveguides.

Given these design constraints, a simple, least-distance, Manhattan geometry for the routing of optical waveguides between semiconductor dies in an MCM may not be difficult to implement. Furthermore, even when a routing solution that minimizes the number of waveguide crossings exists, such routing may be non-optimal (from the perspective of distance) and may end up increasing: the path length, the loss, and/or the associated latency of the optical signal paths.

Additionally, in an MCM, the routing solution may result in a different routing depending on the location of a specific semiconductor die within an array of semiconductor dies. This can lead to different types or instances of components being used at different locations in the array, with a commensurate impact on manufacturing complexity and expense.

From this discussion, it is apparent that low-loss and minimum length optical paths may be desirable in an MCM. Such optical paths can overcome on-chip and off-chip electrical bottlenecks by providing optical data paths with lower latency or delay than corresponding electrical wires. Additionally, these optical paths can provide large aggregate communication bandwidth within the array and/or the ability to add or drop a portion of this bandwidth at each semiconductor die.

Figure 18:
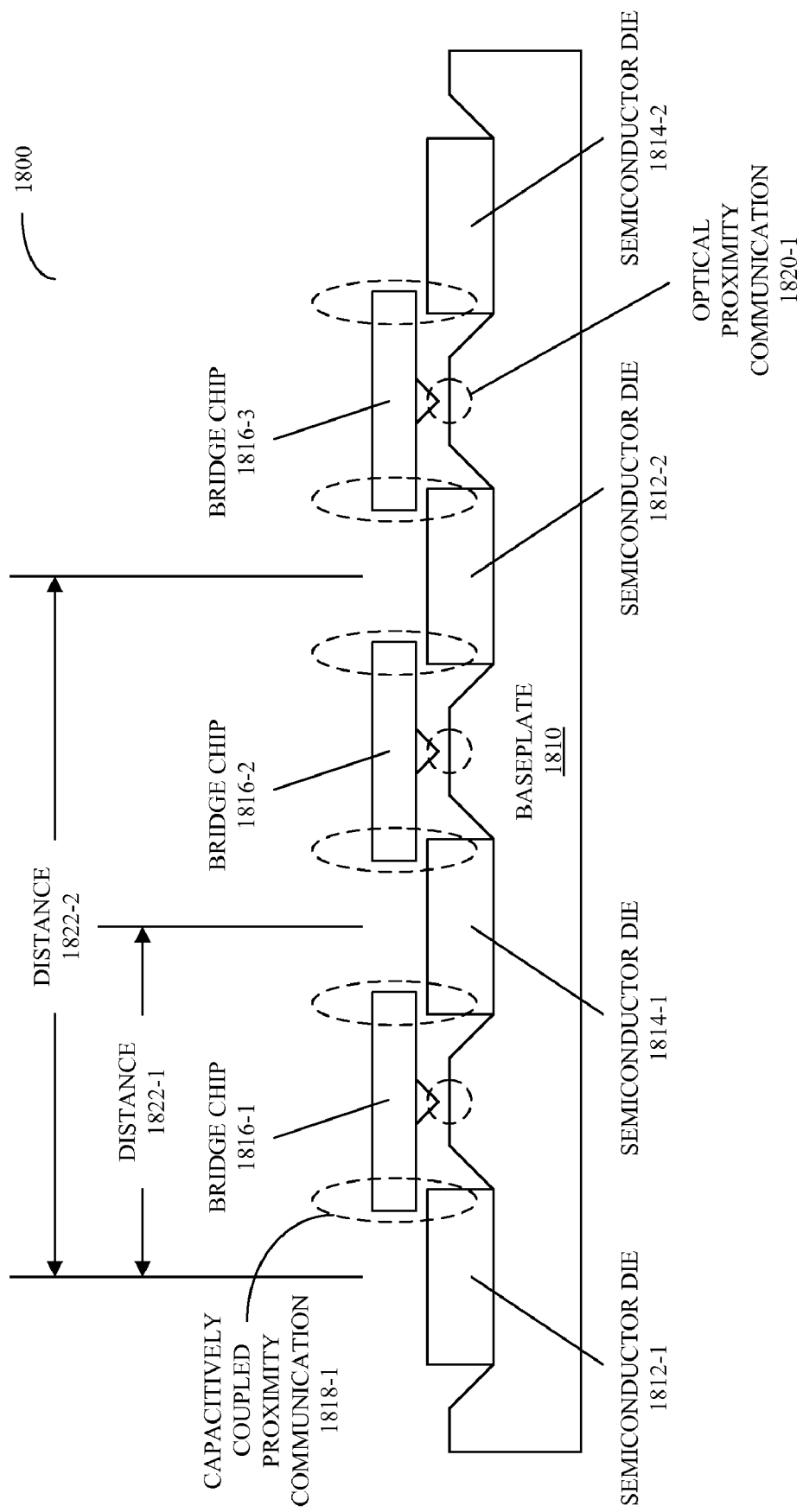
FIG. 18 is a block diagram illustrating a multi-chip module in accordance with an embodiment of the present invention.

One technique for achieving the optical paths is to use an optically enabled baseplate (such as a silicon or a silicon-on-insulator substrate) to provide 3-dimensional optical confinement that facilitates light guiding. This is shown in FIG. 18, which presents a block diagram illustrating an embodiment of an MCM 1800. This MCM includes semiconductor dies 1812 and 1814, bridge chips 1816, and a baseplate 1810 that is configured to communicate optical signals on one or more optical signal paths (not shown), such as one or more optical waveguides (such as one or more polarization-independent waveguides). For example, there may be a grid of optical waveguides along two approximately orthogonal directions on the baseplate 1810.

Bridge chip 1810 may include features (such as depressions) in which semiconductor dies 1812 and 1814 (in an array) may be positioned. In particular, these features may be mechanically coupled to the semiconductor dies 1812 and 1814, and (as described further below) may facilitate mechanical alignment between: the baseplate 1810 and the semiconductor dies 1812, the baseplate 1810 and the semiconductor dies 1814, the bridge chips 1816 and the semiconductor dies 1812, the bridge chips 1816 and the baseplate 1810, and/or the bridge chips 1816 and the semiconductor dies 1814. Note that in some embodiments the mechanical coupling between the bridge chips 1816 and the semiconductor dies 1814 may be rigid. Moreover, in some embodiments these features may also facilitate accurate alignment between neighboring or adjacent semiconductor dies in MCM 1800.

Adjacent semiconductor dies, such as semiconductor die 1812-1 and 1814-1, may be coupled by bridge chips, such as bridge chip 1816-1 (for example, using the configuration illustrated in FIG. 1B). These bridge chips may communicate signals between adjacent semiconductor dies using electrical proximity communication (such as capacitively coupled proximity communication). For example, one semiconductor in a pair of adjacent semiconductor dies (such as semiconductor die 1812-1) may be electrically coupled to the bridge chip 1816-1. Another semiconductor die in the pair of adjacent semiconductor dies (such as semiconductor die 1814-1) may be coupled to a set of proximity connectors (for example, the set of proximity connectors may be deposited on or proximate to a surface of the other semiconductor die). This set of proximity connectors may be coupled, via electrical proximity coupling (such as capacitive coupling), to another set of proximity connectors that are deposited on or proximate to a surface of a given bridge chip.

More generally, electrical proximity communication may be used for communication between semiconductor dies in MCM 1800 that are separated by a distance 1822-1 less than or equal to: one, two or a several semiconductor dies in the array. Consequently, the pair of semiconductor dies may include: one of the semiconductor dies 1812 and one of the semiconductor dies 1814; two of the semiconductor dies 1812; and/or two of the semiconductor dies 1814. Additionally, an intervening semiconductor die may include either one of the semiconductor dies 1812 or one of the semiconductor dies 1814.

Note that in some embodiments, adjacent semiconductor dies are conductively coupled via the given bridge chip. Alternatively, note that in some embodiments adjacent semiconductor dies communicate information using optical communication.

As described previously in FIGS. 2 and 3, mechanical alignment of at least some of the components in the MCM 1800 may be within a pre-determined misalignment. For example the pre-determined misalignment may be along a dimension in a plane that substantially includes the set of proximity connectors or the other set of proximity connectors, and the pre-determined misalignment may be less than one half of a pitch of a subset of the set of the proximity connectors or a subset of the other set of proximity connectors along the dimension. Additionally, the pre-determined misalignment may be along a dimension that is substantially perpendicular to the plane that substantially includes the set of proximity connectors or the other set of proximity connectors.

Moreover, the bridge chips 1816 may include optical imaging and/or optical proximity connectors. These optical connectors may be positioned relative to the one or more waveguides on the baseplate 1810. Using optical imaging and/or optical proximity communication, the bridge chips 1816 may communicate optical signals via the one or more waveguides to other portions of the baseplate 1810. In particular, the bridge chips 1816 may be optically coupled to the baseplate 1810 by optical coupling elements, such as: a lens, a diffraction grating, a micro-sphere and/or a mirror. Additionally, these optical signals may facilitate communication between semiconductor dies in the MCM that are separated by a distance 1822-2 greater than or equal to at least one intervening semiconductor die in the array.

For example, electrical signals may be received at the given bridge chip from a first semiconductor die via electrical coupling (such as during conductive or capacitively coupled proximity communication 1818-1). Next, the electrical signals may be converted into optical signals and coupled to the one or more optical waveguides on the baseplate (for example, using an add-drop component, such as one or more optical proximity connectors during optical proximity communication 1820-1). After traversing the one or more optical waveguides to a desired destination, the optical signals may be coupled to another bridge chip (for example, using another add-drop component, such as one or more additional optical proximity connectors). Moreover, the optical signals may be converted back to electrical signals by another converter, and may be communicated to another semiconductor die via electrical coupling (such as conductive or capacitively coupled proximity communication).

Consequently, in some embodiments, the given bridge component includes a conversion element configured to convert electrical signals to optical signals and another conversion element configured to convert the optical signals to the electrical signals. Moreover, the given bridge component may include an add-drop component configured to insert optical signals on to an optical signal path on the baseplate 1810 and/or to remove the optical signals from the optical signal path.

Note that optical communication of the optical signals across the one or more waveguides may occur in an interrupted manner or in an uninterrupted manner (for example, in a bus with taps at bus locations that correspond to the semiconductor dies in the array). Consequently, the optical signals may be communicated via the one or more optical waveguides, around or through one or more intervening semiconductor dies, without detection or conversion to electrical signals. In some embodiments, the optical signals are optically amplified during transmission in the one or more optical waveguides. Moreover, note that the architecture of MCM 1800 can be used to provide custom optical routing (including adding and dropping of optical signals at the given bridge chip) with low loss, high density and low optical crosstalk, for example, by using waveguides with a lateral dimension substantially larger than 1 μm so as to advantageously reduce loss and crosstalk.

In some embodiments, the optical signal paths in or on the baseplate 1810 may include: optical buses, optical switches, add-drop components, and/or additional passive and active components (such as filters, WDM multiplexers, WDM demultiplexers, amplifiers, and lasers or other optical sources).

Note that MCM 1800 may include fewer components or additional components. Moreover, two or more components may be combined into a single component, and the position of one or more components may be changed.

We now describe embodiments of methods for communicating signals. FIG. 19 presents a flow chart illustrating an embodiment of a process 1900 for communicating signals in an array of CMs. During this method, a second CM receives electrical signals from a first CM via a bridge chip in a multi-chip module (MCM) using electrical proximity communication through electrically coupled proximity connectors (1910). Next, the second CM receives electrical signals from a third CM via bridge chips in the MCM (1912), where the third CM is configured to communicate with another bridge chip using electrical proximity communication through electrically coupled proximity connectors. Note that the bridge chip and the other bridge chip are configured to communicate with each other via optical communication in an optical signal path in a baseplate in the MCM. Additionally, note that a given bridge chip, which can be the bridge chip or the other bridge chip, is configured to communicate with the baseplate using optically coupled proximity communication.

In some embodiments of the process 1900 there may be additional or fewer operations. Moreover, the order of the operations may be changed, and two or more operations may be combined into a single operation.

Figure 20:
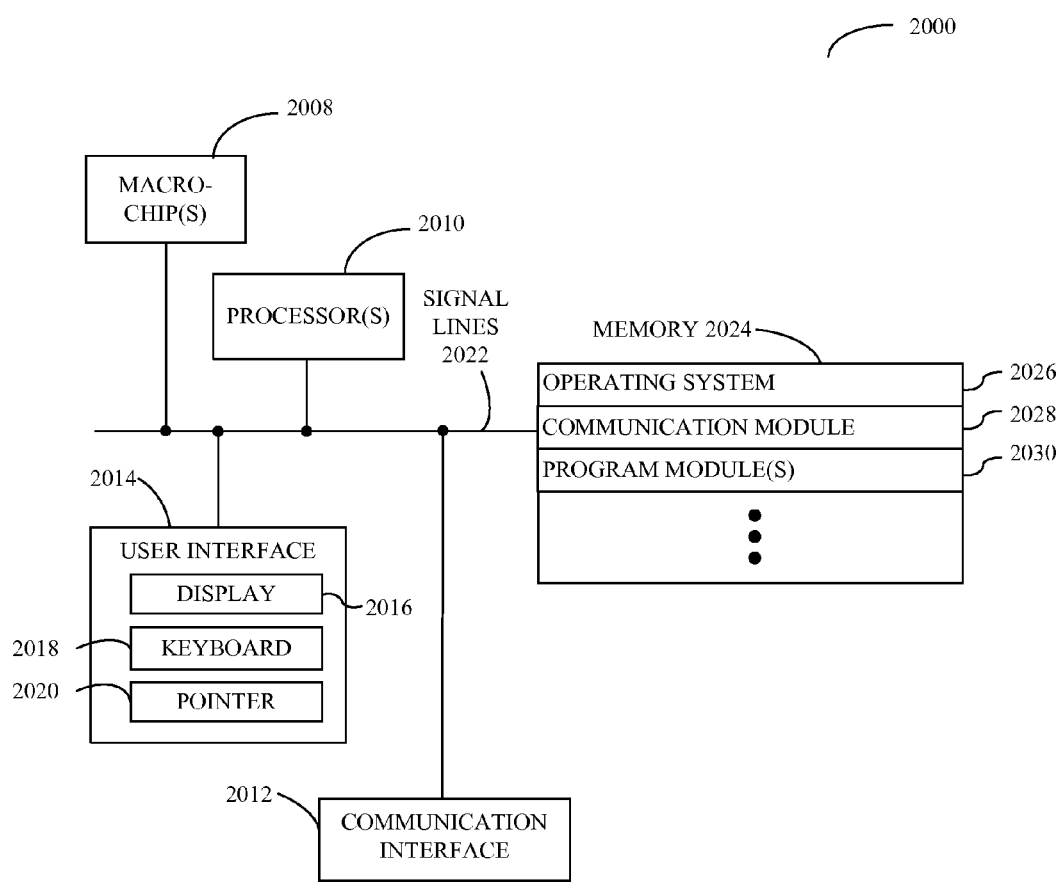
FIG. 20 is a block diagram illustrating a computer system in accordance with an embodiment of the present invention.

Note that the present invention may include systems that contain one or more MCMs and/or switches, which include components (such as one or more semiconductor dies) that communicate signals using electromagnetically coupled proximity connectors, such as capacitively coupled proximity connectors and/or optical proximity connectors. For example, FIG. 20 presents a block diagram illustrating an embodiment of a computer system 2000, which includes one or more processors 2010 (such as one or more processor cores), a communication interface 2012, a user interface 2014, and one or more signal lines 2022 coupling these components together. Note that the one or more processing units 2010 may support parallel processing and/or multi-threaded operation, the communication interface 2012 may have a persistent communication connection, and the one or more signal lines 2022 may constitute a communication bus. Moreover, the user interface 2014 may include a display 2016, a keyboard 2018, and/or a pointer, such as a mouse 2020.

Computer system 2000 may include memory 2024, which may include high speed random access memory and/or nonvolatile memory. More specifically, memory 2024 may include: ROM, RAM, EPROM, EEPROM, FLASH, one or more smart cards, one or more magnetic disc storage devices, and/or one or more optical storage devices. Memory 2024 may store an operating system 2026, such as SOLARIS, LINUX, UNIX, OS X, or WINDOWS, that includes procedures (or a set of instructions) for handling various basic system services for performing hardware dependent tasks. Memory 2024 may also store procedures (or a set of instructions) in a communication module 2028. The communication procedures may be used for communicating with one or more computers and/or servers, including computers and/or servers that are remotely located with respect to the computer system 2000.

Memory 2024 may also include the one or more program modules (of sets of instructions) 2030. Instructions in the program modules 2030 in the memory 2024 may be implemented in a high-level procedural language, an object-oriented programming language, and/or in an assembly or machine language. The programming language may be compiled or interpreted, i.e., configurable or configured to be executed by the one or more processing units 2010.

Computer system 2000 may include one or more macro-chips 2008 (such as one or more MCMs) that include electrical proximity communication and/or optical proximity communication as described in the previous embodiments. While not shown in the computer system 2000, in some embodiments the one or more macro-chips 2008 may be coupled to one or more network interface circuits (such as one or more optical transceivers).

Computer system 2000 may include fewer components or additional components. Moreover, two or more components may be combined into a single component and/or a position of one or more components may be changed. In some embodiments, the functionality of the computer system 2000 may be implemented more in hardware and less in software, or less in hardware and more in software, as is known in the art.

Although the computer system 2000 is illustrated as having a number of discrete items, FIG. 20 is intended to be a functional description of the various features that may be present in the computer system 2000 rather than as a structural schematic of the embodiments described herein. In practice, and as recognized by those of ordinary skill in the art, the functions of the computer system 2000 may be distributed over a large number of servers or computers, with various groups of the servers or computers performing particular subsets of the functions. In some embodiments, some or all of the functionality of the computer system 2000 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A system, comprising:
   a baseplate having an alternating pattern of first alignment features and second alignment features, wherein the baseplate is configured to communicate data signals via optical communication; and
   an array of single-chip modules (SCMs), wherein the array includes:
   first SCMs mechanically coupled to the baseplate, wherein a first SCM is mechanically coupled to a first alignment feature, and wherein the first SCM is electrically coupled to a set of electrical proximity connectors;
   second SCMs mechanically coupled to the baseplate, wherein a second SCM is mechanically coupled to a second alignment feature, and wherein nearest neighbors of the second SCM in the array are first SCMs; and
   bridge components, wherein a bridge component is electrically coupled to the second SCM;
   wherein the bridge component is electrically coupled to another set of electrical proximity connectors;
   wherein the another set of electrical proximity connectors is electrically coupled to the set of electrical proximity connectors, thereby facilitating communication of other data signals between at least adjacent first SCMs and second SCMs via electrical proximity communication; and
   wherein the bridge component is optically coupled to the baseplate, thereby facilitating optical communication of the data signals between SCMs via the baseplate.

2. The system of claim 1, wherein the baseplate includes one or more optical signal paths.

3. The system of claim 2, wherein the optical signal paths include one or more waveguides.

4. The system of claim 2, wherein the data signals are communicated via the optical signal paths as optical signals without intervening processing as electrical signals.

5. The system of claim 1, wherein the bridge component is optically coupled to the baseplate via optical coupling elements.

6. The system of claim 5, wherein the optical coupling elements include a lens, a diffraction grating, a micro-sphere and/or a mirror.

7. The system of claim 1, wherein the data signals are communicated between a pair of SCMs via optical communication when the pair of SCMs in the array is separated by more than a pre-determined distance; and
   wherein the pair of SCMs can include one of the first SCMs and one of the second SCMs, two of the first SCMs, or two of the second SCMs.

8. The system of claim 7, wherein the pre-determined distance corresponds to more than one intervening SCM between the pair of SCMs; and
   wherein the intervening SCM can be one of the first SCMs or one of the second SCMs.

9. The system of claim 1, wherein the other data signals are communicated between a pair of SCMs via electrical proximity communication when the pair of SCMs in the array is separated by less than a pre-determined distance; and
   wherein the pair of SCMs can include one of the first SCMs and one of the second SCMs, two of the first SCMs, or two of the second SCMs.

10. The system of claim 9, wherein the pre-determined distance accommodates at most one intervening SCM between the pair of SCMs; and
    wherein the intervening SCM can be one of the first SCMs or one of the second SCMs.

11. The system of claim 1, wherein electrical proximity communication includes capacitively coupled proximity communication.

12. The system of claim 1, wherein the array of SCMs is a 2-dimensional array of SCMs.

13. The system of claim 1, wherein the bridge component includes a conversion element configured to convert electrical signals to optical signals and another conversion element configured to convert the optical signals to the electrical signals.

14. The system of claim 1, wherein the bridge component includes an add-drop element configured to insert optical signals on to an optical signal path on the baseplate and/or to remove the optical signals from the optical signal path.

15. The system of claim 1, wherein the set of electrical proximity connectors is proximate to a surface of the first SCM; and wherein the other set of electrical proximity connectors is proximate to a surface of the bridge component 16. The system of claim 1, wherein the first alignment features and the second alignment features include depressions; and wherein the first alignment features and the second alignment features facilitate mechanical alignment of: the first SCMs with respect to the baseplate; the bridge components with respect to the baseplate; and the first SCMs with respect to the bridge components.

17. The system of claim 16, wherein the mechanical alignment is within a pre-determined misalignment.

18. The system of claim 17, wherein the pre-determined misalignment is along a dimension in a plane that substantially includes the set of proximity connectors or the other set of proximity connectors; and wherein the pre-determined misalignment is less than one half of a pitch of a subset of the set of the proximity connectors or a subset of the other set of proximity connectors along the dimension.

19. The system of claim 17, wherein the pre-determined misalignment is along a dimension that is substantially perpendicular to a plane that substantially includes the set of proximity connectors or the other set of proximity connectors.

* * * * *